US009778569B2

(12) United States Patent
Seino et al.

(10) Patent No.: US 9,778,569 B2
(45) Date of Patent: Oct. 3, 2017

(54) POSITIVE PHOTOSENSITIVE RESIN COMPOSITION, METHOD FOR PRODUCING FILM USING SAME, AND ELECTRONIC COMPONENT

(71) Applicant: Central Glass Company, Limited, Ube-shi, Yamaguchi (JP)

(72) Inventors: Makoto Seino, Fujimino (JP); Kazuhiro Yamanaka, Tachikawa (JP); Masafumi Oda, Fujimi (JP); Junya Nakatsuji, Fujimino (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 15/033,318

(22) PCT Filed: Oct. 24, 2014

(86) PCT No.: PCT/JP2014/078394
§ 371 (c)(1),
(2) Date: Apr. 29, 2016

(87) PCT Pub. No.: WO2015/064509
PCT Pub. Date: May 7, 2015

(65) Prior Publication Data
US 2016/0266491 A1    Sep. 15, 2016

(30) Foreign Application Priority Data

Nov. 1, 2013  (JP) ................................. 2013-228477
Dec. 6, 2013  (JP) ................................. 2013-253529
Jul. 16, 2014  (JP) ................................. 2014-145650

(51) Int. Cl.
*G03F 7/075*    (2006.01)
*C08L 83/06*    (2006.01)
(Continued)

(52) U.S. Cl.
CPC ........... *G03F 7/0757* (2013.01); *C08G 77/16* (2013.01); *C08G 77/18* (2013.01); *C08L 83/04* (2013.01);
(Continued)

(58) Field of Classification Search
CPC ........ G03F 7/004; G03F 7/038; G03F 7/0757; H01L 21/0271; C08L 83/04; C08L 83/06; C08G 77/16; C08G 77/18
(Continued)

(56) References Cited

U.S. PATENT DOCUMENTS 6,630,560 B2 *  10/2003  McGill ................. B01J 20/285
                                                     422/69
7,968,343 B2 *  6/2011   Poullain ............... C08G 77/045
                                                     422/82.05
(Continued)

FOREIGN PATENT DOCUMENTS

JP    2001-281853 A    10/2001
JP    2001-281861 A    10/2001
(Continued)

OTHER PUBLICATIONS

International Search Report (PCT/ISA/210) issued in PCT Application No. PCT/JP2014/078394 dated Nov. 28, 2014 with English-language translation (four (4) pages).
(Continued)

*Primary Examiner* — Amanda C Walke
(74) *Attorney, Agent, or Firm* — Crowell & Moring LLP

(57) ABSTRACT

A positive photosensitive resin composition according to the present invention contains at least (A) a polysiloxane compound having at least a structural unit of the general formula (1), (B) a photoacid generator or quinone diazide compound and (C) a solvent $$[(R^X)_b R^1_m SiO_{n/2}] \qquad (1)$$

(Continued)

where $R^X$ represents the following group; $R^1$ each represents a hydrogen atom, $C_1$-$C_3$ alkyl group, phenyl group, hydroxy group, $C_1$-$C_3$ alkoxy group or $C_1$-$C_3$ fluoroalkyl group; b represents an integer of 1 to 3; m represents an integer of 0 to 2; n represents an integer of 1 to 3; and b, m and n satisfy b+m+n=4,

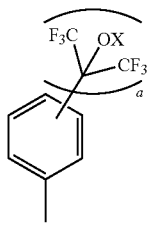

where X each represents a hydrogen atom or acid labile group; and a represents an integer of 1 to 5. It is possible by the use of this positive photosensitive resin composition to provide a film with high resistance and heat-resistant transparency and provide an electronic component with such a film.

27 Claims, 4 Drawing Sheets

(51) Int. Cl.
*C08G 77/18* (2006.01)
*C08G 77/16* (2006.01)
*H01L 21/027* (2006.01)
*C08L 83/04* (2006.01)
*C09D 183/04* (2006.01)
*G03F 7/004* (2006.01)
*G03F 7/023* (2006.01)
*G03F 7/16* (2006.01)
*G03F 7/20* (2006.01)
*G03F 7/32* (2006.01)
*G03F 7/40* (2006.01)

(52) U.S. Cl.
CPC ............ *C08L 83/06* (2013.01); *C09D 183/04* (2013.01); *G03F 7/0046* (2013.01); *G03F 7/0233* (2013.01); *G03F 7/168* (2013.01); *G03F 7/20* (2013.01); *G03F 7/322* (2013.01); *G03F 7/40* (2013.01); *H01L 21/0271* (2013.01)

(58) Field of Classification Search
USPC ......... 430/270.1, 272.1, 322, 325, 329, 330, 430/331; 528/43; 428/447
See application file for complete search history.

(56) References Cited

U.S. PATENT DOCUMENTS

| | | |
|---|---|---|
| 2003/0211407 A1 | 11/2003 | Watanabe et al. |
| 2004/0137241 A1 | 7/2004 | Lin et al. |
| 2004/0143082 A1 | 7/2004 | Iwasawa et al. |
| 2005/0244745 A1 | 11/2005 | Cameron et al. |
| 2009/0286188 A1 | 11/2009 | Hatakeyama et al. |
| 2012/0052439 A1* | 3/2012 | Wu .................. G03F 7/0233 430/270.1 |
| 2013/0101841 A1* | 4/2013 | Yang .................. C07F 9/065 428/345 |
| 2013/0280541 A1* | 10/2013 | Wu .................. G03F 7/039 428/447 |
| 2014/0342166 A1* | 11/2014 | Yang .................. C09D 183/04 428/447 |
| 2014/0378608 A1* | 12/2014 | Yang .................. C09D 183/04 524/588 |

FOREIGN PATENT DOCUMENTS

| | | |
|---|---|---|
| JP | 2002-55456 A | 2/2002 |
| JP | 2004-212983 A | 7/2004 |
| JP | 2005-222040 A | 8/2005 |
| JP | 2005-330488 A | 12/2005 |
| JP | 2006-178436 A | 7/2006 |
| JP | 2008-203612 A | 9/2008 |
| JP | 2008209432 A * | 9/2008 |
| JP | 2009-301007 A | 12/2009 |
| JP | 2010-101957 A | 5/2010 |
| JP | 2011-128469 A | 6/2011 |
| JP | 2012-113160 A | 6/2012 |
| KR | 10-2004-0012777 | 2/2004 |
| WO | WO 2014112584 A1 * | 7/2014 ............ C08G 77/24 |

OTHER PUBLICATIONS

Japanese-language Written Opinion (PCT/ISA/237) issued in PCT Application No. PCT/JP2014/078394 dated Nov. 18, 2014 (three (3) pages).
Korean-language Office Action issued in counterpart Korean Application No. 2016-7014457 dated Apr. 1, 2017 (seven (7) pages).

* cited by examiner

POSITIVE PHOTOSENSITIVE RESIN COMPOSITION, METHOD FOR PRODUCING FILM USING SAME, AND ELECTRONIC COMPONENT

FIELD OF THE INVENTION

The present invention relates to a positive photosensitive resin composition, a method for forming a film from such a resin composition, and an electronic component.

BACKGROUND ART

Flat panel displays such as liquid crystal displays and organic EL displays have interlayer insulating films to insulate wiring layers from each other. The interlayer insulating films need to be formed with hole patterns for electrical connection of the wiring layers while ensuring insulation between the wiring layers. For this reason, the interlayer insulating films are generally made of positive photosensitive materials. As typical positive photoresist materials, there are used compositions in which quinone diazide compounds are added to acrylic resins (see Patent Documents 1 and 2).

In recent years, flat panel displays are often configured as touch panel type displays. In order to improve the transparency and functionality of these flat panel displays, it becomes necessary to perform heat treatment and film forming operation at higher temperatures for the formation of transparent electrodes such as ITO with high transparency and high conductivity. Accordingly, protective films or insulating films for the transparent electrodes need to have heat resistance during high-temperature processing. Acrylic resins are however not sufficient in heat resistance and can cause deterioration in transparency by coloring or deterioration in electrode conductivity by degassing during high-temperature substrate treatment and transparent electrode film forming operation.

On the other hand, polysiloxane compounds are known to have both high heat resistance and high transparency. There are used positive photosensitive resin compositions in which quinone diazide compounds are added to polysiloxane compounds (see Patent Document 3). These materials are high in heat resistance and cause less deterioration in transparency even during high-temperature substrate treatment, thereby being able to form high-transparency films, but are low in alkaline developer solubility and developability. It has thus been increasingly demanded to provide polysiloxane compounds with sufficient alkali developability for fine processing by light exposure. Patent Document 4 discloses, as a component of a positive resist composition for the formation of a high-resolution resist pattern, a polysiloxane compound having introduced therein an acidic group such as phenol group or carboxyl group to impart alkali solubility required for development.

As mentioned above, the introduction of acidic groups such as phenol groups, carboxyl groups, silanol groups and fluorocarbinol groups is an effective technique for imparting alkali solubility to the polysiloxane compounds. For example, there are known positive photosensitive resin compositions containing polysiloxane compounds with phenolic hydroxy groups or carboxyl groups in combination with photoacid generators or quinone diazide compounds (see Patent Documents 5 to 8). These polysiloxane compounds, when used as components of the compositions, exhibit alkaline developer solubility and developability but face problems of low transparency and coloring under high-temperature conditions due to the presence of the phenolic hydroxy group or carboxy groups. In the case of forming films using polysiloxane compounds with silanol groups, there arises a problem with the physical properties of the films due to the occurrence of water elimination or cracking by film loss or condensation reaction when the amounts of silanol groups in the polysiloxane molecules are large. When the amounts of silanol groups in the polysiloxane molecules are small, by contrast, the polysiloxane compounds cannot exhibit sufficient alkali solubility.

From the above, it is known that fluorocarbinol groups are effective in imparting alkali solubility to the polysiloxane compounds without causing loss of transparency and film-forming properties. Among others, a hexafluoroisopropanol group (2-hydroxy-1,1,1,3,3,3-hexafluoroisopropyl group: $C(CF_3)_2OH$ group) is particularly effective. Patent Document 9 discloses that a polysiloxane compound to which a hexafluoroisopropanol group is introduced via a straight, branched or cyclic aliphatic hydrocarbon group is useful as a component of an alkali developable composition. In this polysiloxane compound, the aliphatic hydrocarbon group is formed by hydrosilylation such that the hexafluoroisopropanol group is bonded to a silicon atom via the aliphatic hydrocarbon group. However, such an aliphatic hydrocarbon moiety is thermally decomposed under high-temperature conditions. This polysiloxane compound is thus not sufficient in heat resistance.

PRIOR ART DOCUMENTS

Patent Documents

Patent Document 1: Japanese Laid-Open Patent Publication No. 2001-281853
Patent Document 2: Japanese Laid-Open Patent Publication No. 2001-281861
Patent Document 3: Japanese Laid-Open Patent Publication No. 2006-178436
Patent Document 4: Japanese Laid-Open Patent Publication No. 2005-330488
Patent Document 5: US Patent Application Publication No. 2003/211407
Patent Document 6: Japanese Laid-Open Patent Publication No. 2012-113160
Patent Document 7: Japanese Laid-Open Patent Publication No. 2010-101957
Patent Document 8: Japanese Laid-Open Patent Publication No. 2002-55456

SUMMARY OF THE INVENTION

Problems to be Solved by the Invention

In view of the foregoing circumstances, it is an object of the present invention to provide a positive photosensitive resin composition containing a polysiloxane compound so as to be developable with an aqueous alkaline solution and capable of forming a patterned cured film with high heat resistance and heat-resistant transparency. It is also an object of the present invention to provide an electronic component having such a patterned cured film as a surface protective film or an interlayer insulating film.

Means for Solving the Problems

The present inventors have made extensive researches to solve the above problems and resultantly found that, when a positive photosensitive resin composition is prepared containing at least a polysiloxane compound having a specific structure in its molecule, a photoacid generator or a quinone diazide compound, and a solvent, a film formed from the positive photosensitive resin composition combines alkali developability with heat-resistant transparency.

Namely, the present invention includes the following aspects 1 to 15.

[Inventive Aspect 1]

A positive photosensitive resin composition, comprising at least:

component (A): a polysiloxane compound having at least a structural unit of the general formula (1)

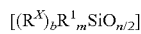 (1)

where $R^X$ represents a group of the following formula; $R^1$ each independently represents a hydrogen atom, a $C_1$-$C_3$ alkyl group, a phenyl group, a hydroxy group, a $C_1$-$C_3$ alkoxy group or a $C_1$-$C_3$ fluoroalkyl group; b represents an integer of 1 to 3; m represents an integer of 0 to 2; n represents an integer of 1 to 3; and b, m and n satisfy a relationship of b+m+n=4,

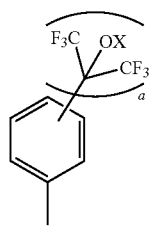

where X each independently represents a hydrogen atom or an acid labile group; and a represents an integer of 1 to 5;

component (B): a photoacid generator or a quinone diazide compound; and component (C): a solvent.

[Inventive Aspect 2]

The positive photosensitive resin composition according to Inventive Aspect 1, wherein, in $R^X$ of the general formula (1), a is 1 to 3.

[Inventive Aspect 3]

The positive photosensitive resin composition according to Inventive Aspect 1 or 2, wherein $R^X$ of the general formula (1) is any of the following formulas

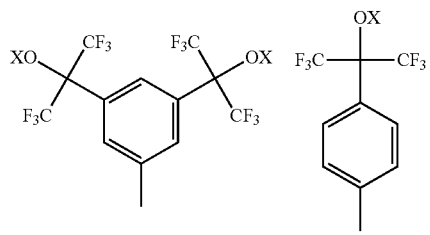

[Inventive Aspect 4]

The positive photosensitive resin composition according to any one of Inventive Aspects 1 to 3, wherein, in the general formula (1), b is 1.

[Inventive Aspect 5]

The positive photosensitive resin composition according to Inventive Aspect 4, wherein, in the general formula (1), n is 3.

[Inventive Aspect 6]

The positive photosensitive resin composition according to any one of Inventive Aspects 1 to 5, wherein the polysiloxane compound as the component (A) further has a structural unit of the general formula (2)

 (2)

where $R^Y$ each independently represents a hydrogen atom, a $C_1$-$C_3$ alkyl group, a phenyl group, a $C_1$-$C_3$ alkoxy group or a $C_1$-$C_3$ fluoroalkyl group; p represents an integer of 0 to 3; q represents an integer of 1 to 4; and p and q satisfy a relationship of p+q=4.

[Inventive Aspect 7]

The positive photosensitive resin composition according to Inventive Aspect 6, wherein the number of the structural units of the general formula (2) in the polysiloxane compound as the component (A) is 0.1 to 10 per one structural unit of the general formula (1).

[Inventive Aspect 8]

The positive photosensitive resin composition according to Inventive Aspect 6 or 7, wherein, in the general formula (1), n is 3.

[Inventive Aspect 9]

The positive photosensitive resin composition according to any one of Inventive Aspects 1 to 8, further comprising at least one kind selected from the group consisting of a surfactant, a silane coupling agent and a dissolution inhibitor.

[Inventive Aspect 10]

A positive photosensitive resin film formed from the positive photosensitive resin composition according to any one of Inventive Aspects 1 to 9.

[Inventive Aspect 11]

A method for producing a patterned cured film, comprising:

forming a positive photosensitive resin film by applying the positive photosensitive resin composition according to any one of Inventive Aspects 1 to 9 to a substrate and drying the applied positive photosensitive resin composition;

exposing the positive photosensitive resin film;

developing the exposed positive photosensitive resin film with an aqueous alkaline solution, thereby obtaining a patterned resin film; and heating the patterned resin film.

[Inventive Aspect 12]

A patterned cured film produced by the method according to Inventive Aspect 11.

[Inventive Aspect 13]

A laminated body comprising at least the patterned cured film produced by the method according to Inventive Aspect 11 and a substrate.

[Inventive Aspect 14]

An electronic component comprising the patterned cured film produced by the method according to Inventive Aspect 11 as a surface protective film or an interlayer insulating film.

[Inventive Aspect 15]

A method for producing a patterned resin film, comprising:

forming a positive photosensitive resin film by applying the positive photosensitive resin composition according to any one of Inventive Aspects 1 to 9 to a substrate and drying the applied positive photosensitive resin composition;

exposing the positive photosensitive resin film; and developing the exposed positive photosensitive resin film with an aqueous alkaline solution, thereby obtaining the patterned resist film.

It is possible according to the present invention to provide the positive photosensitive resin composition having alkali developability and capable of forming a patterned cured film with high heat-resistant transparency. It is also possible to provide the electronic component having such a patterned cured film as a surface protective film or an interlayer insulating film.

DESCRIPTION OF EMBODIMENTS

Figure 1:
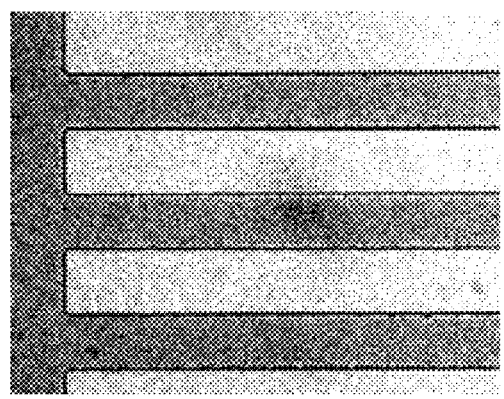
FIG. 1 is a photograph of a line pattern formed from a composition 1-3 according to Example 1-3 of the present invention.

The present invention will be described below by way of the following embodiments. It should however be noted that the respective configurations and combination in each embodiment are merely examples. Various additions, omissions, replacements and other alterations of the respective configurations are possible without departing from the scope of the present invention. The present invention is not limited to the following embodiments and is defined by the appended claims.

Hereinafter, the polysiloxane compound as the component (A), the photoacid generator or quinone diazide compound as the component (B), the solvent as the component (C), the positive photosensitive resin composition containing these components (A) to (C), the film formed from the positive photosensitive resin composition and the electronic component having the film will be explained in order below.

[1. Component (A): Polysiloxane Compound]

The polysiloxane compound used as the component (A) in the present invention is a polysiloxane compound having at least a structural unit of the general formula (1) (hereinafter sometimes referred to as "polysiloxane compound (1)").

$$[(R^X)_b R^1_m SiO_{n/2}] \quad (1)$$

In the general formula (1), $R^X$ represents a group of the following formula; and, when there a plurality of $R^X$, $R^X$ can be the same or different.

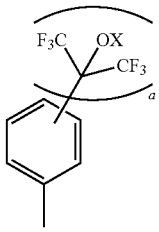

In the above formula, X each independently represents a hydrogen atom or an acid labile group; when there are a plurality of X, X can be the same or different; and a represents an integer of 1 to 5.

Further, $R^1$ each independently represents a hydrogen atom, a $C_1$-$C_3$ alkyl group, a phenyl group, a hydroxy group, a $C_1$-$C_3$ alkoxy group or a $C_1$-$C_3$ fluoroalkyl group; when there are a plurality of $R^1$, $R^1$ can be the same or different; b represents an integer of 1 to 3; m represents an integer of 0 to 2; n represents an integer of 1 to 3; and b, m and n satisfy a relationship of b+m+n=4.

Examples of the $C_1$-$C_3$ alkyl group as $R^1$ are methyl, ethyl, propyl and isopropyl. Among others, methyl is preferred.

Examples of the $C_1$-$C_3$ alkoxy group as $R^1$ are methoxy, ethoxy, propoxy and isopropoxy. Among others, methoxy and ethoxy are preferred.

The $C_1$-$C_3$ fluoroalkyl group as $R^1$ is a group obtained by substituting a part or all of hydrogen atoms of the $C_1$-$C_3$ alkyl group with a fluorine atom. Examples of the $C_1$-$C_3$ fluoroalkyl group as $R^1$ are, but are not limited to, trifluoromethyl, perfluoroethyl, perfluoropropyl, 2,2,2-trifluoroethyl and 3,3,3-trifluoroethyl. Among others, trifluoromethyl and 3,3,3-trifluoropropyl are preferred.

In view of the availability of the raw material, a methyl group, a phenyl group, a methoxy group, an ethoxy group and a hydroxy group are preferred as R'.

Herein, $O_{n/2}$ of the general formula (1) is an expression widely used for polysiloxane compounds. The following formulas (1-1), (1-2) and (1-3) correspond to the cases where n is 1, the case where n is 2 and the case where n is 3, respectively. In the case where n is 1, the corresponding structural unit is located at a terminal end of a polysiloxane chain of the polysiloxane compound.

(1-1)

(1-2)

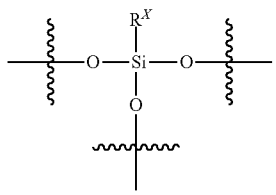

(1-3)

In the formulas (1-1), (1-2) and (1-3), $R^X$ has the same meaning as in the general formula (1); $R^a$ and $R^b$ have the same meanings as $R^X$ and $R^1$ in the general formula (1); and each line segment intersecting wavy line indicates a bonding position.

In the present invention, the polysiloxane compound (1) has a $C(CF_3)_2OX$ group directly introduced into an aromatic ring moiety to which a silicon atom is bonded. In the $C(CF_3)_2OX$ group, X can be either a hydrogen atom or an acid labile group as mentioned above.

In the case where X is a hydrogen atom, the polysiloxane compound (1) exhibits good alkaline developer solubility. Both of the positive photosensitive resin composition containing the polysiloxane compound (1) and the photosensitive resin film formed therefrom also exhibit good alkaline developer solubility. When the alkaline developer solubility of the polysiloxane compound (1) is too higher than a desired level, it is feasible to retard the alkaline developer solubility and suppress the occurrence of film loss during development by decreasing the number of $C(CF_3)_2OX$ groups in the polysiloxane compound or by adding the quinone diazide compound as the component (B). As will be explained later, the quinone diazide compound gets decomposed by light exposure so as to release a nitrogen atom, form a carboxylic acid group in its molecule and thereby impart alkaline developer solubility. Thus, the addition of such a quinone diazide compound to the photosensitive resin composition enables positive pattern formation by retarding the alkaline developer solubility of unexposed parts of the photosensitive resin film and increasing the alkaline developer solubility of exposed parts of the photosensitive resin film.

In the case where X is an acid labile group, the polysiloxane compound (1) exhibits alkaline developer solubility lower than in the case where X is a hydrogen atom. Both of the positive photosensitive resin composition containing the polysiloxane compound (1) and the photosensitive resin film formed therefrom also exhibit lower alkaline developer solubility. Namely, it is feasible to suppress the occurrence of film loss during alkali development in the case where X is an acid labile group. This acid labile group is decomposed and eliminated by the action of an acid. Thus, the presence of such an acid labile group enables alkali development by suppressing the occurrence of film loss in unexposed parts of the photosensitive resin film and imparting alkaline developer solubility to only exposed parts of the photosensitive resin film.

There is no particular limitation on the kind of the acid labile group. The acid labile group can be, but is not limited to, an alkoxycarbonyl group, an acetal group, a silyl group or an acyl group. Examples of the alkoxycarbonyl group are tert-butoxycarbonyl, tert-amyloxycarbonyl, methoxycarbonyl, ethoxycarbonyl and i-propoxycarbonyl. Examples of the acetal group are methoxymethyl, ethoxyethyl, butoxyethyl, cyclohexyloxyethyl, benzyloxyethyl, phenethyloxyethyl, ethoxypropyl, benzyloxypropyl, phenethyloxypropyl, ethoxybutyl and ethoxyisobutyl. Examples of the silyl group are trimethylsilyl, ethyldimethylsilyl, methyldiethylsilyl, triethylsilyl, i-propyldimethylsilyl, methyldi-i-propoxysilyl, tri-i-propylsilyl, tert-butyldimethylsilyl, methyldi-tert-butylsilyl, tri-tert-butylsilyl, phenyl dimethylsilyl, methyldiphenylsilyl and triphenylsilyl. Examples of the acyl group are acetyl, propionyl, butyryl, heptanoyl, hexanoyl, valeryl, pivaloyl, isovaleryl, lauroyl, myristoyl, palmitoyl, stearoyl, oxalyl, malonyl, succinyl, glutaryl, adipoyl, piperoyl, suberoyl, azelaoyl, sebacoyl, acryloyl, propioloyl, methacryloyl, crotonoyl, oleoyl, maleoyl, fumaroyl, mesaconoyl, camphoroyl, benzoyl, phthaloyl, isophthaloyl, terephthaloyl, naphthoyl, toluoyl, hydroatropoyl, atropoyl, cinnamoyl, furoyl, thenoyl, nicotinoyl and isonicotinoyl. As the acid labile group, there can also be used any of those obtained by substituting a part or all of hydrogen atoms of the above acid labile groups with a fluorine atom. One kind or two or more kinds of acid labile groups can be introduced into the polysiloxane compound (1).

Among others, a tert-butoxycarbonyl group is preferably used as the acid labile group because the tert-butoxycarbonyl group can be readily removed by decomposition to gaseous 2-methylpropene and carbon dioxide through heat treatment.

The alkaline developer solubility of the exposed parts depends on the amount of the hexafluoroisopropanol group contained in the polysiloxane compound. There is no particular limitation on the amount of the hexafluoroisopropanol group contained in the polysiloxane compound as long as the positive photosensitive resin composition and the photosensitive resin film formed therefrom exhibit alkaline developer solubility. It is preferable that the polysiloxane compound has 0.1 to 5 hexafluoroisopropanol groups per one silicon atom.

In the present invention, the polysiloxane compound (1) where at least one X is a hydrogen atom and the polysiloxane compound (1) where at least one X is an acid labile group may be used in combination. The combined use of such polysiloxane compounds makes it possible to adjust the contrast between the alkaline dissolution rates of the exposed parts and the unexposed parts. In the case of using the polysiloxane compounds in combination, the content ratio of the polysiloxane compounds is not particularly limited and can be set to an arbitrary value.

There is no particular limitation on the mass average molecular weight of the polysiloxane compound in the present invention. The mass average molecular weight of the polysiloxane compound is preferably 1000 to 200000, more preferably 2000 to 100000. Herein, the mass average molecular weight refers to a value determined by gel permeation chromatography (GPC) on the basis of a calibration curve using polystyrene as a standard material. When the mass average molecular weight of the polysiloxane compound is smaller than 1000, there may arise an adverse influence on the physical properties of the photosensitive resin film due the occurrence of film cracking etc. during the formation of the photosensitive resin composition under heat-temperature conditions. When the mass average molecular weight of the polysiloxane compound is larger than 200000, there may arise a problem such as too low solubility of the polysiloxane compound in the after-mentioned solvent component (C) or too viscosity of the resulting solution.

There is no particular limitation on the polysiloxane compound as long as the polysiloxane compound has at least the structural unit of the general formula (1). In view of ease of production, it is preferable that a is an integer of 1 to 3 in the polysiloxane compound. Preferable examples of the polysiloxane compound are those having the following groups as $R^X$ of the general formula (1).

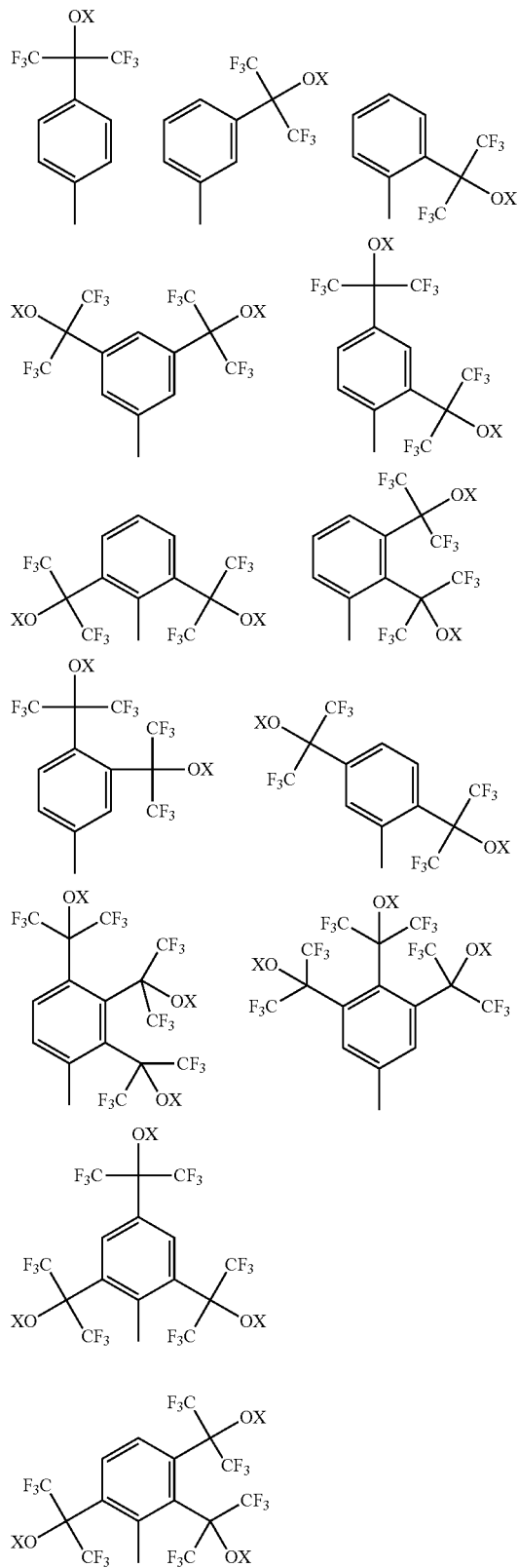

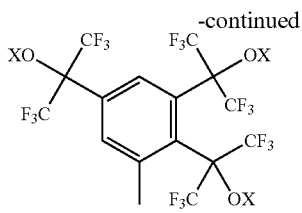

In the above formulas, X each independently represents a hydrogen atom or an acid labile group.

Among others, a is more preferably an integer of 1 to 2 in view of ease of production. Particularly preferable examples of the polysiloxane compound are those having any of the following groups as $R^X$.

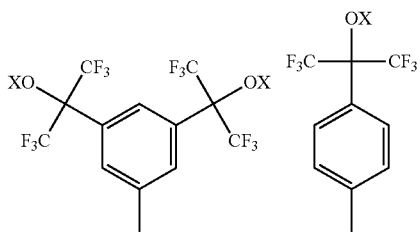

In view of ease of production, it is preferable that b is 1 in the polysiloxane compound having the structural unit of the general formula (1). Even in this case, it is preferable that a is an integer of 1 to 3, more preferably 1 to 2.

Further, it is preferable that m is 0 in the polysiloxane compound having the structural unit of the general formula (1). Even in this case, it is preferable that b is 1. It is more preferable that a is an integer of 1 to 3, still more preferably 1 to 2. Such a polysiloxane compound is easily formed into a film shape and thus is suitably usable in the positive photosensitive resin composition.

In the present invention, the polysiloxane compound may have, in addition to the structural unit of the general formula (1), a structural unit of the general formula (2) in order to control the physical properties such as heat resistance and alkaline developer solubility of the polysiloxane compound.

$$[Si(R^Y)_pO_{q/2}] \qquad (2)$$

In the general formula (2), $R^Y$ each independently represents a hydrogen atom, a $C_1$-$C_3$ alkyl group, a phenyl group, a $C_1$-$C_3$ alkoxy group or a $C_1$-$C_3$ fluoroalkyl group; p represents an integer of 0 to 3; q represents an integer of 1 to 4; p and q satisfy a relationship of p+q=4; and, when p is 2 or 3, $R^Y$ can be the same or different.

Herein, $O_{q/2}$ of the general formula (2) is an expression widely used for polysiloxane compounds. The following formulas (2-1), (2-2), (2-3) and (2-4) correspond to the case where q is 1, the case where q is 2, the case where q is 3 and the case where q is 4, respectively. In the case where q is 1, the corresponding structural unit is located at a terminal end of a polysiloxane chain of the polysiloxane compound.

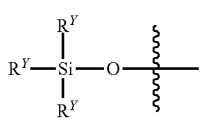

(2-1)

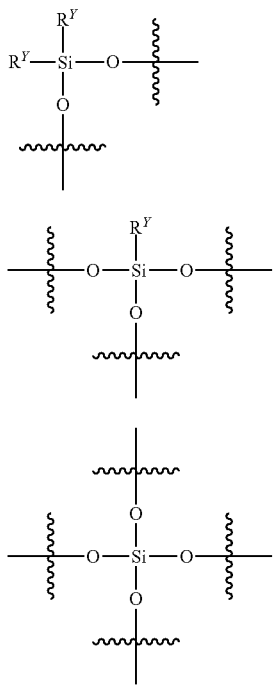

(2-2)

(2-3)

(2-4)

In the formulas (2-1), (2-2), (2-3) and (2-4), $R^Y$ has the same meaning as in the general formula (2); and each line segment intersecting wavy line indicates a bonding position.

Examples of the $C_1$-$C_3$ alkyl group as $R^Y$ are methyl, ethyl, propyl and isopropyl. Among others, methyl is preferred.

Examples of the $C_1$-$C_3$ alkoxy group as $R^Y$ are methoxy, ethoxy, propoxy amd isopropoxy. Among others, methoxy and ethoxy are preferred.

The $C_1$-$C_3$ fluoroalkyl group as $R^Y$ is a group obtained by substituting a part or all of hydrogen atoms of the $C_1$-$C_3$ alkyl group with a fluorine atom. Examples of the $C_1$-$C_3$ fluoroalkyl group as $R^1$ are, but are not limited to, trifluoromethyl, perfluoroethyl, perfluoropropyl, 2,2,2-trifluoroethyl and 3,3,3-trifluoroethyl. Among others, trifluoromethyl and 3,3,3-trifluoropropyl are preferred.

In view of the availability of the raw material, a hydrogen atom, a methyl group, a phenyl group, a methoxy group and an ethoxy group are preferred as $R^Y$.

There is no particular limitation on the content ratio of the structural unit of the general formula (1) and the structural unit of the general formula (2) in the polysiloxane compound as the component (A). The number of the structural units of the general formula (2) in the polysiloxane compound is preferably 0.1 to 10, more preferably 0.2 to 5, per one structural unit of the general formula (1). When the number of the structural units of the general formula (2) in the polysiloxane compound is less than 0.1, the alkali solubility of the exposed parts may become too high. When the number of the structural units of the general formula (2) in the polysiloxane compound is more than 10, the alkali solubility of the exposed parts may not be imparted sufficiently.

As mentioned above, it is feasible in the present invention to contain both of the structural unit of the general formula (1) and the structural unit of the general formula (2) in the polysiloxane compound as the component (A). In this case, the structural unit of the general formula (1) may include the structural unit where X is a hydrogen atom and the structural unit where X is an acid labile group. The combined use of the structural unit where X is a hydrogen atom and the structural unit where X is an acid labile group makes it possible to adjust the contrast between the alkaline dissolution rates of the exposed parts and the unexposed parts during development. The content ratio of the structural unit where X is a hydrogen atom and the structural unit where X is an acid labile group is not particularly limited and can be set to an arbitrary value.

There is no particular limitation on the method for production of the polysiloxane compound having the structural unit of the general formula (1).

In the case of the polysiloxane compound (1) where X is a hydrogen atom, for example, it is feasible to produce the polysiloxane compound (1) by hydrolysis and condensation of at least a compound of the general formula (3).

$$Si(R^X)_b R^1_m R^2_n \quad (3)$$

In the general formula (3), $R^1$, $R^X$, b, m and n have the same meanings as in the general formula (1); $R^2$ represents a $C_1$-$C_3$ alkoxy group; and, when there a plurality of $R^2$, $R^2$ can be the same or different.

The compound of the general formula (3) can be used solely or in combination of two or more kinds thereof in the hydrolysis and condensation.

In order to control the physical properties such as heat resistance and alkaline developer solubility of the polysiloxane compound, a silane compound of the general formula (4) may additionally be used in the hydrolysis and condensation.

$$Si(R^Y)_p (R^Z)_q \quad (4)$$

The silane compound of the general formula (4) can be used solely or in combination of two or more kinds thereof.

In the case of the polysiloxane compound where X is an acid labile group, it is feasible to produce the polysiloxane compound by introducing the acid labile group into the product of the above hydrolysis and condensation reaction. In the general formula (4), $R^Y$, p and q have the same meanings as in the general formula (2); and $R^Z$ represents a chlorine atom or a $C_1$-$C_3$ alkoxy group with the proviso that, when $R^Z$ is a chlorine atom, any of $R^Y$ is not a $C_1$-$C_3$ alkoxy group, that is, the chlorine atom and the alkoxy group are not simultaneously bonded to the same silicone atom.

Examples of the silane compound of the general formula (4) with the $C_1$-$C_3$ alkoxy group are tetramethoxysilane, tetraethoxysilane, trimethoxysilane, triethoxysilane, dimethyldimethoxysilane, diphenyldimethoxysilane, methylphenyldimethoxysilane, methyltrifluoromethyldimethoxysilane, methyl(3,3,3-trifluoropropyl)dimethoxysilane, di(3,3,3-trifluoropropyl)dimethoxysilane, dimethyl diethoxysilane, methyltrifluoromethyldimethoxysilane, methyl(3,3,3-trifluoropropyl)diethoxysilane, di(3,3,3-trifluoropropyl)diethoxysilane, diphenyldiethoxysilane, methylphenyldiethoxysilane, trimethylmethoxysilane, triphenylmethoxysilane, methyltrimethoxysilane, phenyltrimethoxysilane, trifluoromethyltrimethoxysilane, 3,3,3-trifluoropropyltrimethoxysilane, methyltriethoxysilane, phenyltriethoxysilane, trimethoxyethoxysilane, triphenylethoxysilane, trifluoromethyltriethoxysilane and 3,3,3-trifluoropropyltriethoxysialen. Examples of the silane compound of the general formula (4) with the chorine atom are tetrachlorosilane, trichlorosilane, methyltrichlorosilane, phenyltrichlorosilane, dimethyldichlorosilane, diphenyldichlorosilane, methylphenyldichlorosilane, trimethylchlorosilane and triphenylchlorosilane.

In the production of the polysiloxane compound, the hydrolysis and condensation of the compound of the general formula (3) together with the compound of the general formula (4) makes it possible to adjust the amount of the hexafluoroisopropanol group contained in the polysiloxane compound and thereby control the physical properties such as heat resistance and alkaline developer solubility of the polysiloxane compound.

The hydrolysis and condensation of the compound of the general formula (3) will be explained below.

It is feasible to perform the hydrolysis and condensation by mixing the compound of the general formula (3) and, optionally, the silane compound of the general formula (4) with water for the hydrolysis, an acid catalyst or base catalyst for acceleration of the hydrolysis and condensation and a reaction solvent, and then, stirring the resulting reaction solution at room temperature (i.e. atmospheric temperature without heating or cooling as generally ranging from about 15 to 30° C.; the same applies to the following) or while heating. By this reaction, there is obtained the polysiloxane compound (1) where X is a hydrogen atom. In the case of using the silane compound of the general formula (4), the thus-obtaine polysiloxane compound (1) where X is a hydrogen atom also has the structural unit of the general formula (2). In the case where the silane compound of the general formula (4) is a chlorosilane compound having a chlorine atom as $R^Z$, the catalyst is not necessarily used because the chlorosilane compound readily reacts with water, silanol etc. to generate a hydrochloric acid so that the hydrochloric acid acts as an acid catalyst. When the hydrolysis and condensation is performed with heating, it is preferable to use a closed-system reactor or to use a reactor with a condenser for reflux of the reaction system in order to prevent evaporation of unreacted raw material, water, acid catalyst or base catalyst and reaction solvent from the reaction system. Although the time required for the hydrolysis and condensation varies depending on the kind of the catalyst used, the hydrolysis and condensation reaction time is generally in the range of 3 to 24 hours. The hydrolysis and condensation reaction temperature is generally in the range of room temperature to 180° C. After the reaction, water, by-produced alcohol and the acid catalyst or base catalyst remain in the reaction system. It is preferable to remove such water, alcohol and catalyst from the polysiloxane compound for ease of handling of the polysiloxane compound. The water, alcohol and catalyst can be removed by extraction or by adding any solvent that does not affect the reaction, such as toluene, to the reaction system and azeotropically distilling the reaction system with a Dean-Stark trap.

There is no particular limitation on the amount of water used in the hydrolysis and condensation reaction. The amount of water used is preferably 0.5 to 5.0 moles in terms of mole ratio relative to the amount of reactive group, that is, alkoxy group or chlorine atom in the raw starting silicon compound.

There is no particular limitation on the acid catalyst or base catalyst as long as the catalyst performs a catalytic activity in the hydrolysis and condensation reaction of the alkoxysilane. Examples of the catalyst are hydrochloric acid, sulfuric acid, nitric acid, phosphoric acid, boric acid, acetic acid, trifluoroacetic acid, trifluoromethanesulfonic acid, formic acid, oxalic acid, maleic acid, benzenesulfonic acid, tosic acid, sodium hydroxide and potassium hydroxide. The amount of the catalyst used is not particularly limited. It suffices to use the catalyst in a so-called catalytic amount by which the hydrolysis and condensation reaction can proceed.

There is also no particular limitation on the solvent used in the hydrolysis and condensation reaction. The solvent is preferably a polar solvent, more preferably an alcohol solvent, in view of the solubility of the raw starting compound, water and catalyst in the solvent. The kind of the alcohol solvent is not particularly limited. Examples of the alcohol solvent are methanol, ethanol, 1-propanol, 2-propanol, 1-butanol and 2-butanol. The solvent is not necessarily used in the hydrolysis and condensation reaction. It is feasible to perform the hydrolysis and condensation reaction by mixing the raw material compound, water and solvent. For production of the high-molecular-weight polysiloxane compound or from the viewpoint of production, there is a case where the use of no solvent is preferred.

Next, the introduction of the acid labile group to the hydrolysis and condensation reaction product of the general formula (3) will be explained below.

It is feasible to adopt, as the acid labile group introduction method, a conventionally known ordinary method for introduction of an acid labile group to an alcohol. For example, the acid labile group can be introduced by reacting the hydrolysis and condensation reaction product of the general formula (3) with a dialkyl dicarbonate compound or an alkoxycarbonylalkyl halide in a solvent in the presence of a base. As one example of the introduction of the acid labile group, the following explanation will be given of the introduction of a tert-butoxycarbonyl group that is easily deprotectable by heat treatment and thereby suitably usable as the acid labile group. The tert-butoxycarbonyl group is introduced to the hydrolysis and condensation reaction product of the general formula (3) by adding di-tert-butyl dicarbonate in an equivalent molar amount or more with respect to the amount of hexafluoroisopropanol's hydroxy group in the hydrolysis and condensation reaction product, and then, dissolving and reacting these compounds in a solvent in the presence of a base such as pyridine, trimethylamine or N,N-dimethylaminopyridine. There is no particularly limitation on the solvent as long as the compounds added to the reaction system are dissolved in the solvent with no adverse influence on the reaction. Preferred examples of the solvent are toluene, xylene and pyridine. Although the reaction temperature and time vary depending on the kind of the base used, the reaction temperature is generally in the range of room temperature to 180° C.; and the reaction time is generally in the range of 1 to 24 hours. After the completion of the reaction, the polysiloxane compound (1) having tert-butoxycarbonyl as X is obtained by evaporating the solvent, base and, when the di-tert-butyl dicarbonate is excessively added, excessive di-tert-butyl dicarbonate.

[2. Component (B): Photoacid Generator and Quinone Diazide Compound]

In the present invention, the photoacid generator or quinone diazide compound is used as the component (B) in the positive photosensitive resin composition.

There is no particular limitation on the kind of the photoacid generator as long as the photoacid generator generates an acid by light exposure. It is preferable to select the photoacid generator that gives sufficient contrast in the resist pattern after development. As the photoacid generator, there can be used a sulfonium salt, iodonium salt, sulfonium diazomethane, N-sulfonyloxyimide or oxime O-sulfonate. One kind or two or more kinds of photoacid generators can be used. Examples of the photoacid generator available as commercial products are, but are not limited to: those under the trade names of Irgacure PAG121 Irgacure PAG103, Irgacure CGI1380 and Irgacure CGI725 (all manufactured by U.S. BASF); those under the trade names of PAI-101, PAI-106, NAI-105, NAI-106, TAZ-110 and TAZ-204 (all manufactured by Midori Kagaku Co., Ltd.); those under the trade names of CPI-200K, CPI-210S, CPI-101A, CPI-110A, CPI-100P, CPI-110P, CPI-100TF, HS-1, HS-1A, HS-1P, HS-1N, HS-1TF, HS-1NF, HS-1MS, HS-1CS, LW-S1 and LW-S1NF (all manufactured by San-Apro Ltd.); and those under the trade names of TFE-triazine, TME-triazine and MP-triazine (all manufactured by Sanwa Chemical Co., Ltd.).

As the quinone diazide compound is decomposed by light exposure to release a nitrogen atom and form a carboxylic acid group in its molecule, the addition of such a quinone diazide compound leads to improvement in the alkaline developer solubility of the exposed parts of the photosensitive resin film while retarding the alkaline developer solubility of the unexposed parts of the photosensitive resin film. Thus, the photosensitive resin composition containing the quinone diazide compound enables positive pattern formation due to contrast in alkaline developer solubility between the exposed parts and the unexposed parts. There is no particular limitation on the kind of the quinone diazide compound. The quinone diazide compound is preferably a naphthoquinone diazide compound in which a naphthoquinone diazide sulfonic acid is ester-bonded to a compound having at least phenolic hydroxy group and, more specifically, a naphthoquinone diazide compound in which a naphthoquinone diazide sulfonic acid is ester-bonded to a phenolic hydroxyl-containing compound having a hydrogen atom, a hydroxy group or a substituent group of the general formula (5) at each of ortho and para positions of phenolic hydroxy group.

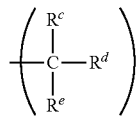
(5)

In the general formula (5), $R^c$, $R^d$ and $R^e$ each independently represent a $C_1$-$C_{10}$ alkyl group, a carboxyl group, a phenyl group or a substituted phenyl group.

In the general formula (5), the $C_1$-$C_{10}$ alkyl group can be substituted or unsubstituted. Examples of the $C_1$-$C_{10}$ alkyl group are methyl, ethyl, n-propyl, isopropyl, n-butyl, isobutyl, t-butyl, n-hexyl, cyclohexyl, n-heptyl, n-octyl, trifluoromethyl and 2-carboxyethyl.

Further, there can be used a hydroxy group, a methoxy group etc. as a substituent of the substituted phenyl group in the general formula (5). There is no particular limitation on the number and position of substituent in the substituted phenyl group.

It is feasible to produce the naphthoquinone diazide compound by known esterification of the compound having at least the phenolic hydroxy group and the naphthoquinone diazide sulfonic acid chloride.

Examples of the compound having at least the phenolic hydroxy group are those indicated below.

-continued

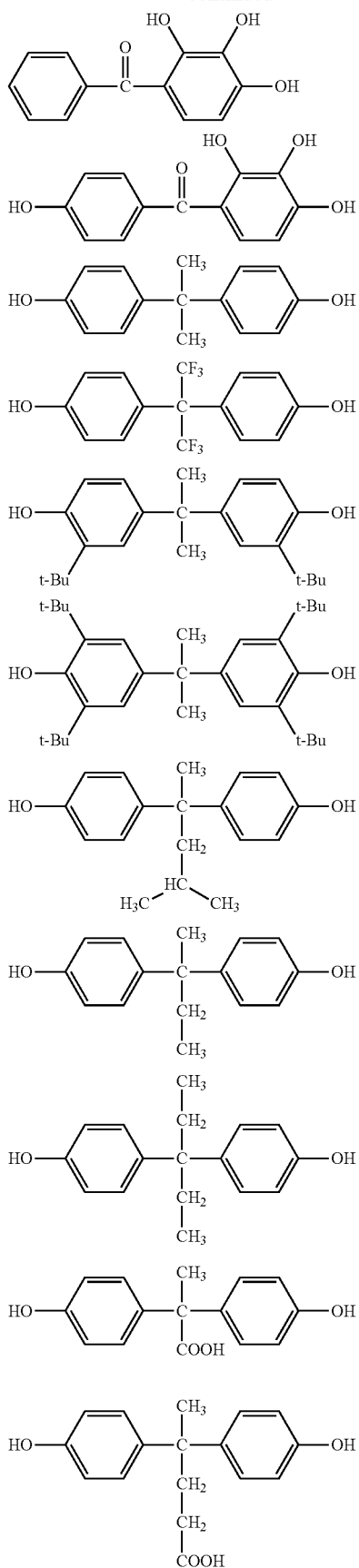

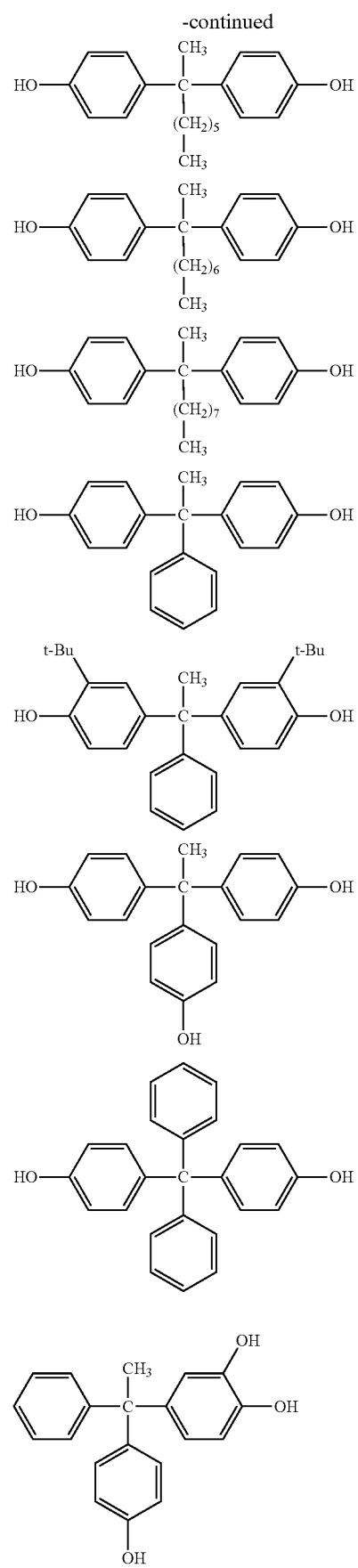
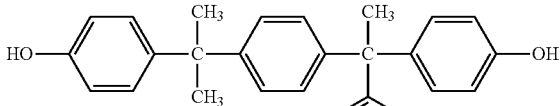
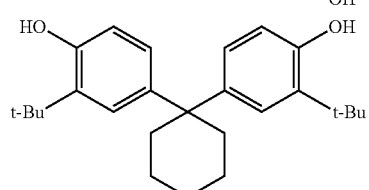
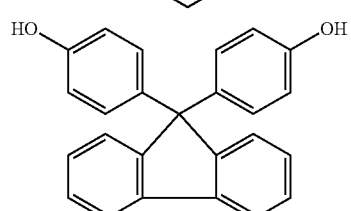
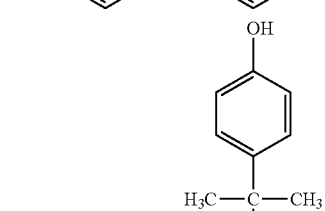
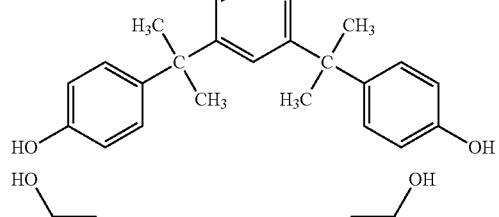
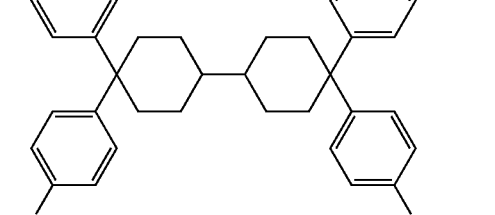
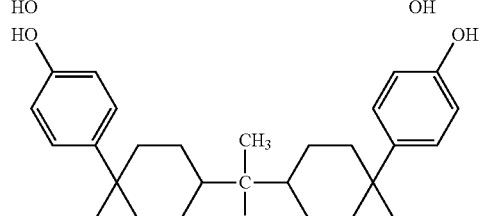

In the above compounds, Me represents a methyl group; and t-Bu represents a tert-butyl group (the same applies to the following).

Examples of the naphthoquinone diazide sulfonic acid chloride are 4-naphthoquinone diazide sulfonic acid chloride and 5-naphthoquinone diazide sulfonic acid chloride as indicated below.

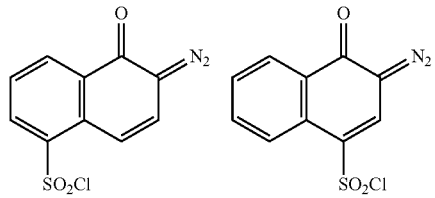

In the present specification, the compound obtained by esterification of the compound having at least the phenolic hydroxy group and 4-naphthoquinone diazide sulfonic acid chloride is sometimes referred to as "4-naphthoquinone diazide sulfonic acid ester compound"; and the compound obtained by esterification of the compound having at least the phenolic hydroxy group and 5-naphthoquinone diazide sulfonic acid chloride is sometimes referred to as "5-naphthoquinone diazide sulfonic acid ester compound".

The 4-naphthoquinone diazide sulfonic acid ester compound is suitable for exposure to i-ray light because it has an absorption in the i-ray region (wavelength: 365 nm). On the other hand, the 5-naphthoquinone diazide sulfonic acid ester compound is suitable for exposure to light in a wide wavelength range because it has an absorption over a wide wavelength range. It is thus preferable in the present invention to select and use either the 4-naphthoquinone diazide sulfonic acid ester compound or the 5-naphthoquinone diazide sulfonic acid ester compound as the quinone diazide compound depending on the wavelength of the exposure light. The 4-naphthoquinone diazide sulfonic acid ester compound and the 5-naphthoquinone diazide sulfonic acid ester compound may be used in the form of a mixture thereof.

Preferred examples of the quinone diazide compound are those indicated below.

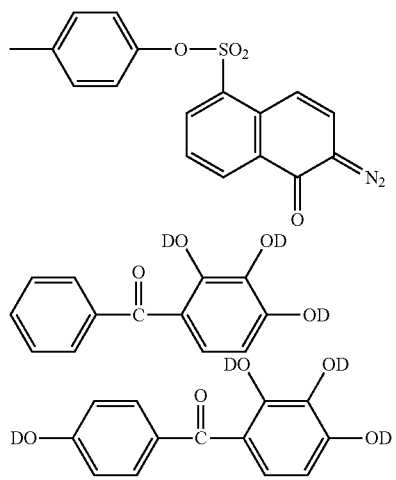

In the above compound, D each independently represents a hydrogen atom or the following functional group.

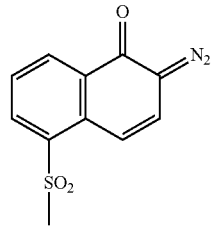

In the molecular structure of the above quinone diazide compound, at least one of D is the following functional group.

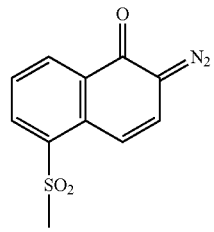

There is no particular limitation on the amount of the photoacid generator or quinone diazide compound used as the component (B) in the present invention. In the case of using the photoacid generator as the component (B), the amount of the photoacid generator used is preferably 0.01 to 30 parts by mass, more preferably 0.1 to 20 parts by mass, still more preferably 0.5 to 10 parts by mass, per 100 parts by mass of the polysiloxane compound as the component (A). When the amount of the photoacid generator is less than 0.01 parts by mass, it may be difficult to give sufficient contrast in the developed pattern. When the amount of the photoacid generator exceeds 30 parts by mass, the photosensitive resin film may be deteriorated in transparency by the photoacid generator. In the case of using the quinone diazide compound as the component (B), the amount of the quinone diazide compound used is preferably 1 to 50 parts by mass, more preferably 2 to 30 parts by mass, per 100 parts by mass of the polysiloxane compound as the component (A). When the amount of the quinone diazide compound is less than 1 parts by mass, it may be difficult to impart photosensitivity suitable for practical use due to poor solubility contrast between the exposed parts and the unexposed parts. The amount of the quinone diazide compound used is particularly preferably 2 parts by mass or more for good solubility contrast. When the amount of the quinone diazide compound exceeds 50 parts by mass, the photosensitive resin film may be deteriorated in transparency by film whitening due to decrease of compatibility between the polysiloxane compound and the quinone diazide compound or by coloring with the quinone diazide compound. The amount of the quinone diazide compound used is particularly preferably 30 parts by mass or less for high film transparency.

[3. Component (C): Solvent]

There is no particular limitation on the kind of the solvent used as the component (C) in the present invention as long as the polysiloxane compound as the component (A) and the photoacid generator and quinone diazide compound as the component (B) are dissolved in the solvent. Examples of the solvent are, but are not limited to, cyclohexanone, propylene glycol monomethylether acetate, propylene glycol monomethylether, cyclohexanone, ethyl butyrate, γ-butyrolactone, N,N-dimethylformamide, N,N-dimethylacetamide and N-methylpyrrolidone.

There is no particular limitation on the concentration of the polysiloxane compound as the component (A) and the photoacid generator and quinone diazide compound as the component (B) dissolved in the solvent as the component (C). The amount of the component (A) is preferably 5 to 50 mass %, more preferably 10 to 40 mass %, based on the total amount of the positive photosensitive resin composition. The positive photosensitive resin composition can be formed into a thick film when the concentration of the component (A) in the positive photosensitive resin composition is high.

[4. Positive Photosensitive Resin Composition Containing Components (A), (B) and (C)]

In the present invention, the positive photosensitive resin composition is prepared by mixing at least the polysiloxane compound as the component (A), the photoacid generator or quinone diazide compound as the compound (B) and the solvent as the component (C). There is no particular limitation on the method for mixing of these components. It is preferable that the components (A) and (B) are substantially uniformly dispersed in the solvent as the component (C).

The positive photosensitive resin composition may contain, in addition to the components (A), (B) and (C), any other additive as needed. For example, it is feasible to use, as the additive, a surfactant for improvement of film-forming properties such as applicability, defoamability and leveling properties, a silane coupling agent for improvement of improvement of adhesion and a dissolution inhibitor for increase in difference between dissolution rates of exposed and unexposed parts. These additives can be used in a normal amount that does not impair the effects of the present invention. One kind or two or more kinds of additives can be used in the positive photosensitive resin composition.

As the surfactant, there can preferably be used an ionic surfactant. Specific examples of the surfactant are perfluoroalkylpolyoxyethylene ethanol, fluorinated alkyl ester, perfluoroalkylamine oxide and fluorine-containing organosiloxane.

Specific examples of the silane coupling agent are methyltrimethoxysilane, methyltriethoxysilane, dimethyldimethoxysilane, dimethyldiethoxysilane, ethyltrimethoxysilane, ethyltriethoxysilane, n-propyltrimethoxysilane, n-propyltriethoxysilane, n-butyltrimethoxysilane, n-butyltriethoxysilane, phenyltrimethoxysilane, phenyltriethoxysilane, diphenyldimethoxysilane, diphenyldiethoxysilane, vinyltrimethoxysilane, vinyltriethoxysilane, 3-methacryloxypropyltrimethoxysilane, 3-methacryloxypropyltriethoxysilane, 3-methacryloxypropylmethyldimethoxysilane, 3-methacryloxypropylmethyldiethoxysilane, 3-acryloxypropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, 3-glycidoxypropyltrimethoxysilane, 3-glycidoxypropyltriethoxysilane, 3-glycidoxypropylmethyldiethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, 3-mercaptopropylmethyldimethoxysilane, 3-ureidopropyltriethoxysilane, 3-isocyanatepropyltriethoxysilane, 3-trimethoxysilylpropylsuccinic acid and N-tert-butyl-3-(3-trimethoxysilylpropyl)succinic imide.

As the dissolution inhibitor, there can be used a compound having an average molecular weight of 100 to 1000, preferably 150 to 800, and having two or more phenolic hydroxy groups, a part or all of hydrogen atoms of which are each substituted with an acid labile group. In this compound, the average rate of substitution of the acid labile group is generally 20 to 100%, preferably 30 to 100%, of the whole of the hydrogen atoms of the phenolic hydroxy groups. Specific examples of the dissolution inhibitor are tert-butoxycarbonyl-protected phenols such as di-tert-butoxycarbonyl resorcin, di-tert-butoxycarbonyl phloroglucin, 2,4-di-tert-butoxycarbonyloxy benzophenone, 2,3,4-tri-tert-butoxycarbonyloxy benzophenone, 2,2',4,4'-tetra-tert-butoxycarbonyloxy benzophenone, 4,4'-di-tert-butoxycarbonyloxy diphenylsulfone, tris(4-tert-butoxycarbonyloxyphenyl)methane, di-tert-butoxycarbonyl hydroquinone, 4,4'-di-tert-butoxycarbonyloxy biphenyl, di-tert-butoxycarbonyl bisphenol A and di-tert-butoxycarobnyl bisphenol F. The amount of the dissolution inhibitor used is generally 5 to 50 parts by mass, preferably 10 to 30 parts by mass, per 100 parts by mass of the component (A). One kind or two or more kinds of dissolution inhibitors can be used.

[5. Film Formed from Positive Photosensitive Resin Composition]

The positive photosensitive resin composition is developable with an alkaline solution and is capable of forming a patterned cured film with high heat resistance and transparency.

For example, there is provided a method for producing a patterned cured film from the positive photosensitive resin composition, including the steps of: forming a positive photosensitive resin film by applying and drying the positive photosensitive resist composition onto a substrate (positive photosensitive resin film formation step); exposing the positive photosensitive resin film (exposure step); developing the exposed positive photosensitive resin film with an alkaline solution, thereby obtaining a patterned resin film (development step); and heating the patterned resin film (heating step).

[Positive Photosensitive Resin Film Formation Step]

The positive photosensitive resin composition is applied as a coating film (also referred to as "positive photosensitive resin film") to the substrate. The substrate can be selected depending on the purpose of use of the film. As the substrate, there can be used a semiconductor substrate such as silicon wafer, a ceramic substrate, a glass substrate, a metal substrate, a plastic substrate etc. It is feasible to apply the positive photosensitive resin composition to the substrate by solution coating with the use of e.g. a bar coater, a spin coater or a roll coater. The coating film is dried to remove the solvent therefrom. Although there is no particular limitation on the drying process, it is preferable to dry the coating film by heating. In this case, there is no particularly limitation on the heating temperature. The heating temperature is set depending on the kind of the solvent used and is generally preferably 60 to 150° C., more preferably 80 to 140° C.

[Exposure Step]

The above coating film (positive photosensitive resin film) is patterned into a desired shape (also referred to as "patterned resin film") by exposing the coating film through a light shielding plate (mask) of desired pattern shape, washing away and removing the exposed parts of the coating film with the alkaline developer.

As the positive photosensitive resin film is formed from the positive photosensitive resin composition, either the photoacid generator or the quinone diazide compound is contained as the composition component in the positive photosensitive resin film as mentioned above. When the predetermined parts of the positive photosensitive resin film are exposed to light, these exposed parts allow the photoacid generator to generate an acid or allow the quinone diazide compound to release a nitrogen atom by decomposition and form a carboxylic acid group in its molecule. The alkaline developer permeability and solubility of the exposed parts of the positive photosensitive resin film are improved by the action of the acid or carboxylic acid group. In the case where the acid labile group is contained in the polysiloxane compound, alkaline developer solubility is imparted by elimination of the acid labile group. It is thus possible to process the positive photosensitive resin film into a positive pattern by exposing the positive photosensitive resin film to light and washing the exposed positive photosensitive resin film with the alkaline developer.

The exposure can be performed by a known process. There can be used a low pressure mercury lamp, a high pressure mercury lamp, a super-high pressure mercury lamp, A KrF excimer laser (wavelength: 248 nm), an ArF excimer layer (wavelength: 193 nm) etc. as a light source for the exposure. There is no particular limitation on the exposure amount. The exposure amount can be adjusted according to the amount of the photoacid generator used, the processes for production of the patterned cured film and the like and is generally of the order of 1 to 10000 mJ/cm$^2$, more preferably of the order of 10 to 5000 mJ/cm$^2$.

It is feasible to perform post-exposure heating on the exposed positive photosensitive resin film as required before the development. The post-exposure heating temperature is preferably 60 to 180° C. The post-exposure heating time is preferably 1 to 30 minutes.

[Development Step]

The exposed positive photosensitive resin film is developed using the alkaline solution as the developer. There is no particular limitation on the alkaline developer as long as the exposed parts of the positive photosensitive resin film are removed by the alkaline developer in a predetermined development process. As the alkaline developer, there can be used an aqueous alkaline solution containing an inorganic alkali, a primary amine, a secondary amine, a tertiary amine, an alcohol amine, a quaternary ammonium salt or a mixture thereof. Specific examples of the alkaline developer are aqueous solutions of potassium hydroxide, sodium hydroxide, ammonia, ethylamine, diethylamine, trimethylamine, triethanolamine and tetramethyammounium hydroxide (abbreviated as "TMAH"). Among others, the aqueous solution of TMAH is preferred. It is particularly preferable to use the aqueous solution containing TMAH in an amount of 0.1 to 5 mass %, more preferably 2 to 3 mass %. The development process can a known process such as immersion development process, paddle development process or spray development process. The development time is generally 0.1 to 3 minutes, preferably 0.5 to 2 minutes. It is feasible to obtain the target patterned film (referred to as "patterned resin film") on the substrate by washing, rinsing and drying as required after the development.

[Heating Step]

The patterned resin film is preferably subjected to heating after the development, so as to cause condensation of alkoxy and silanol groups remaining as unreacted groups in the polysiloxane compound (A) and, in the case where the acid labile group is contained in the polysiloxane compound, thermally decompose and remove the acid labile group. The heating temperature is preferably 80 to 400° C., more preferably 100 to 350° C. When the heating temperature is low, the acid labile group and alkoxy and silanol groups may remain. When the heating temperature is too high, there may occur thermal decomposition of the polysiloxane compound or breakage (cracking) of the film. By this heating, the target cured film of desired pattern (also referred to as "patterned cured film") is obtained on the substrate.

The patterned cured film maintains high transparency even after the above heat treatment. The patterned cured film is high in transparency and heat resistance and is thus suitably usable as a surface protective film or interlayer insulating film in an organic EL (electro luminescence) display, touch panel, liquid crystal display etc. The patterned cured film is also applicable to a microlens.

As mentioned above, the patterned cured film is easily formed from the positive photosensitive resin composition. It is thus feasible to easily produce a laminated body by forming the patterned cured film as a layer on the substrate as mentioned above.

[6. Electronic Component]

In the present invention, the electronic component has, as a surface protective film or an interlayer insulating film, the patterned cured film produced by the above method. More specifically, the patterned cured film is usable as a surface protective film or interlayer insulating film of a semiconductor device, an interlayer insulating film of a multilayer wiring board or the like. The patterned cured film is particularly suitably usable as a surface protective film or interlayer insulating film of an organic EL display, a touch panel or a liquid crystal display. There is no particular limitation on the electronic component in the present invention as long as the surface protective film or interlayer insulating film of the electronic component is formed from the above-mentioned photosensitive resin composition. The electronic component can be provided in various cross-sectional configurations.

EXAMPLES

The present invention will be described in more detail below by way of the following examples. It should however be noted that the following examples are not intended to limit the present invention thereto.

[Synthesis of Silicon Compounds as Raw Material]

Silicon compounds were synthesized in the following preparation examples and subjected to structural analysis by $^1$H-NMR, $^{19}$F-NMR, $^{13}$C-NMR and $^{29}$Si-NMR measurements using a 400-MHz nuclear magnetic resonance spectrometer (NMR, model: AL400 manufactured by JEOL Ltd.).

Preparation Example 1

[3,5-Di(2-hydroxy-1,1,1,3,3,3-hexafluoroisopropyl)-1-triethoxysilylbenzene]

Into a 1-L three-neck flask, 60.95 g (165 mmol) of tetrabutylammonium iodide, 2.85 g (7.5 mmol) of bis(acetonitrile)(1,5-cyclooctadiene)rhodium (I) tetrafluoroborate and 73.36 g (150 mmol) of 3,5-di(2-hydroxy-1,1,1,3,3,3-hexafluoroisopropyl)-1-bromobenzene were put under an argon atmosphere. Subsequently, 500 mL of degassed N,N-dimethylformamide and 100 mL of degassed triethylamine were put into the flask. The above compounds were dissolved in the mixed solvent of N,N-dimethylformamide and triethylamine by stirring and heating at 80° C. Into this reaction system, 49.28 g (300 mmol) of triethoxysilane was dropped. The reaction system was then subjected to stirring at 80° C. for 3 hours. After the completion of the reaction, N,N-dimethylformamide and trimethylamine were evaporated from the reaction system. The reaction system was stirred with 1 of diisopropyl ether for 10 minutes, thereby precipitating a salt. The precipitated salt was filtered out from the reaction system. The resulting diisopropyl ether solution was washed three times with an aqueous solution containing a small amount of sodium chloride. Activated carbon was added into the solution. The solution was stirred and left still for 12 hours. The activated carbon was filtered out from the solution through a Celite column, followed by adding magnesium sulfate to the solution. After the solution was stirred and left still for 3 hours, diisopropyl ether was evaporated. The thus-obtained reaction product was subjected to vacuum distillation under the conditions of a temperature of 120 to 160° C. and a pressure of 180 Pa, thereby yielding 35.54 g (yield: 40%) of 3,5-di(2-hydroxy-1,1,1,3,3,3-hexafluoroisopropyl)-1-triethoxysilylbenzene of the formula (6).

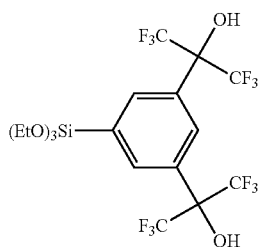

(6)

In the formula (6), Et represents an ethyl ($CH_2CH_3$) group. In the present specification, the same applies to the following.

The $^1$H-NMR, $^{19}$F-NMR, $^{13}$C-NMR and $^{29}$Si-NMR measurement results of the 3,5-di(2-hydroxy-1,1,1,3,3,3-hexafluoroisopropyl)-1-triethoxysilylbenzene of the formula (6) are indicated below.

$^1$H-NMR: δ 8.18 (1H, s), 8.11 (2H, s), 3.88 (6H, q, J=7.0 Hz), 3.80 (2H, s), 1.24 (9H, t, J=7.0 Hz)

$^{19}$F-NMR (solvent: $CDCl_3$, $CCl_3F$): δ −76.01 (s)

$^{13}$C-NMR (solvent: $CDCl_3$): δ 134.66 (s), 133.12 (s), 130.06 (s), 127.26 (s), 122.71 (q, J=285.7 Hz), 77.29 (sep, J=29.9 Hz), 59.25 (s), 18.12 (s)

$^{29}$Si-NMR (solvent: $CDCl_3$, relaxation agent: chromium (III) acetylacetonate): δ −60.38 (s)

Preparation Example 2

[4-(2-Hydroxy-1,1,1,3,3,3-hexafluoroisopropyl)-1-triethoxysilylbenzene]

Into a 1-L three-neck flask, 60.95 g (165 mmol) of tetrabutylammonium iodide, 1.71 g (4.5 mmol) of bis(acetonitrile)(1,5-cyclooctadiene)rhodium (I) tetrafluoroborate and 48.45 g (150 mmol) of 4-(2-hydroxy-1,1,1,3,3,3-hexafluoroisopropyl)-1-bromobenzene were put under an argon atmosphere. Subsequently, 500 mL of degassed N,N-dimethylformamide and 100 mL of degassed triethylamine were put into the flask. The above compounds were dissolved in the mixed solvent of N,N-dimethylformamide and triethylamine by stirring and heating at 80° C. Into this reaction system, 49.28 g (300 mmol) of triethoxysilane was dropped. The reaction system was then subjected to reaction by stirring at 80° C. for 3 hours. After the completion of the reaction, N,N-dimethylformamide and trimethylamine were evaporated from the reaction system. The reaction system was stirred with 1 of diisopropyl ether for 10 minutes, thereby precipitating a salt. The precipitated salt was filtered out from the reaction system. The resulting diisopropyl ether solution was washed three times with an aqueous solution containing a small amount of sodium chloride. Activated carbon was added into the solution. The solution was stirred and left still for 12 hours. The activated carbon was filtered out from the solution through a Celite column, followed by adding magnesium sulfate to the solution. After the solution was stirred and left still for 3 hours, diisopropyl ether was evaporated. The thus-obtained reaction product was subjected to vacuum distillation under the conditions of a temperature of 120 to 160° C. and a pressure of 200 Pa, thereby yielding 36.17 g (yield: 59%) of 4-(2-hydroxy-1,1,1,3,3,3-hexafluoroisopropyl)-1-triethoxysilylbenzene of the formula (7).

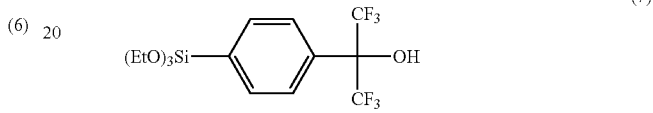

(7)

The $^1$H-NMR, $^{19}$F-NMR, $^{13}$C-NMR and $^{29}$Si-NMR measurement results of the 4-(2-hydroxy-1,1,1,3,3,3-hexafluoroisopropyl)-1-triethoxysilylbenzene of the formula (7) are indicated below.

$^1$H-NMR (solvent: $CDCl_3$): δ 7.74 (4H, dd, J=18.6, 8.3 Hz), 3.89 (6H, q, J=7.0 Hz), 3.57 (1H, s), 1.26 (9H, t, J=7.0 Hz)

$^{19}$F-NMR (solvent: $CDCl_3$, $CCl_3F$): δ −75.94 (s)

$^{13}$C-NMR (solvent: $CDCl_3$): δ 134.87 (s), 133.32 (s), 132.02 (s), 125.97 (s), 122.74 (q, J=287.6 Hz), 77.15 (sep, J=29.7 Hz), 58.95 (s), 17.98 (s)

$^{29}$Si-NMR (solvent: $CDCl_3$, relaxation agent: chromium (III) acetylacetonate): δ −58.52 (s)

[Preparation of Positive Photosensitive Resin Compositions]

Polysiloxane compounds were produced in the following examples and comparative examples. Each of the polysiloxane compounds were tested for the mass average molecular weight and thermal decomposition temperature by the following methods.

Mass Average Molecular Weight

The mass average molecular weight (Mw) of each of the polysiloxane compounds produced in the following examples and comparative examples was determined in terms of polystyrene by gel permeation chromatography (GPC, model: HLC-8320GPC manufactured by Tosoh Corporation, solvent: tetrahydrofuran).

Thermal Decomposition Temperature

Each of the polysiloxane compounds produced in the following examples and comparative examples was dried in an oven of 150° C. and subjected to thermogravimetric analysis (TGA, model: TG8120 manufactured by Rigaku Corporation). In the thermogravimetric analysis, the temperature at which the polysiloxane compound had a weight loss of 5% relative to its initial weight was determined as the thermal decomposition temperature ($T_{d5}$).

Example 1-1

Into a 50-mL flask, 8.59 g (15 mmol) of the 3,5-di(2-hydroxy-1,1,1,3,3,3-hexafluoroisopropyl)-1-triethoxysilylbenzene, 0.81 g (45 mmol) of water and 0.045 g (0.75 mmol) of acetic acid were put. The resulting solution was subjected to reaction by stirring at 100° C. for 12 hours. After the completion of the reaction, toluene was added to the solution. The solution was subjected to reflux (bath temperature: 150° C.) to evaporate water, by-produced ethanol and acetic acid and further evaporate toluene. As a result, the polysiloxane compound 1-1 was obtained in an amount of 7.64 g. The mass average molecular weight Mw of the polysiloxane compound 1-1 was determined to be 2663 by GPC; and the thermal decomposition temperature $T_{d5}$ of the polysiloxane compound 1-1 was determined to be 397° C. A composition 1-1 was prepared by adding 0.03 g of a photoacid generator of the following formula (8) (product name: CPI-100TF manufactured by San-Apro Ltd.) and 2 g of propylene glycol monomethyl ether acetate to 1 g of the polysiloxane compound 1-1.

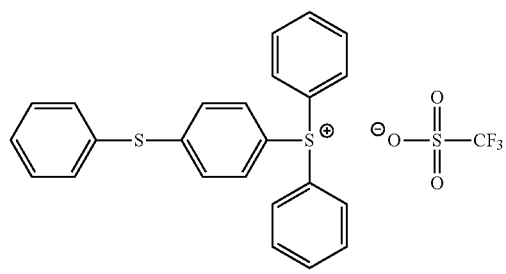

(8)

Example 1-2

First, 6.10 g (15 mmol) of the 4-(2-hydroxy-1,1,1,3,3,3-hexafluoroisopropyl)-1-triethoxysilylbenzene, 0.81 g (45 mmol) of water and 0.045 g (0.75 mmol) of acetic acid were mixed together. The resulting solution was subjected to reaction by stirring at 100° C. for 12 hours. After the completion of the reaction, toluene was added to the solution. The solution was subjected to reflux (bath temperature: 150° C.) to evaporate water, by-produced ethanol and acetic acid and further evaporate toluene. As a result, the polysiloxane compound 1-2 was obtained in an amount of 4.43 g. The mass average molecular weight Mw of the polysiloxane compound 1-2 was determined to be 7022 by GPC; and the thermal decomposition temperature $T_{d5}$ of the polysiloxane compound 1-2 was determined to be 388° C. A composition 1-2 was prepared in the same manner as in Example 1-1 except for using the polysiloxane compound 1-2 in place of the polysiloxane compound 1-1.

Example 1-3

Into a 50-mL flask, 4.58 g (8 mmol) of the 3,5-di(2-hydroxy-1,1,1,3,3,3-hexafluoroisopropyl)-1-triethoxysilyl-benzene, 6.35 g (32 mmol) of phenyltrimethoxysilane, 2.16 g (120 mmol) of water and 0.12 g (2 mmol) of acetic acid were put. The resulting solution was subjected to reaction by stirring at 100° C. for 12 hours. After the completion of the reaction, toluene was added to the solution. The solution was subjected to reflux (bath temperature: 150° C.) to evaporate water, by-produced ethanol and acetic acid and further evaporate toluene. As a result, the polysiloxane compound 1-3 was obtained in an amount of 8.60 g. The mass average molecular weight Mw of the polysiloxane compound 1-3 was determined to be 3475 by GPC; and the thermal decomposition temperature $T_{d5}$ of the polysiloxane compound 1-3 was determined to be 408° C. A composition 1-3 was prepared in the same manner as in Example 1-1 except for using the polysiloxane compound 1-3 in place of the polysiloxane compound 1-1.

Example 1-4

Into a 50-mL flask, 5.59 g (13.75 mmol) of the 4-(2-hydroxy-1,1,1,3,3,3-hexafluoroisopropyl)-1-triethoxysilyl-benzene, 2.23 g (11.25 mol) of phenyltrimethoxysilane, 1.35 g (75 mmol) of water and 0.075 g (1.25 mmol) of acetic acid were put. The resulting solution was subjected to reaction by stirring at 100° C. for 12 hours. After the completion of the reaction, toluene was added to the solution. The solution was subjected to reflux (bath temperature: 150° C.) to evaporate water, by-produced ethanol and acetic acid and further evaporate toluene. As a result, the polysiloxane compound 1-4 was obtained in an amount of 5.67 g. The mass average molecular weight Mw of the polysiloxane compound 1-4 was determined to be 15603 by GPC; and the thermal decomposition temperature $T_{d5}$ of the polysiloxane compound 1-4 was determined to be 419° C. A composition 1-4 was prepared in the same manner as in Example 1-1 except for using the polysiloxane compound 1-4 in place of the polysiloxane compound 1-1.

Example 2-1

A composition 2-1 was prepared by adding 0.06 g of quinone diazide compound PC-5 (manufactured by Toyo Gosei Co., Ltd.) and 1.2 g of cyclohexanone to 0.3 g of the polysiloxane compound 1-1 obtained in Example 1-1.

Example 2-2

A composition 2-2 was prepared in the same manner as in Example 2-1 except for using the polysiloxane compound 1-2 obtained in Example 1-2 in place of the polysiloxane compound 1-1.

Example 2-3

A composition 2-3 was prepared in the same manner as in Example 2-1 except for using the polysiloxane compound 1-3 obtained in Example 1-3 in place of the polysiloxane compound 1-1.

Example 2-4

A composition 2-4 was prepared in the same manner as in Example 2-1 except for using the polysiloxane compound 1-4 obtained in Example 1-4 in place of the polysiloxane compound 1-1.

Example 3-1

Into a 20-mL flask, 1.845 g of the polysiloxane compound 1-1 obtained in Example 1-1, 0.049 g (0.4 mmol) of N,N-dimethyl-4-aminopyridine, 5 mL of pyridine and 3.492 g (16 mmol) of di-tert-butyl dicarbonate were put. The resulting solution was subjected to reaction by stirring at 100° C. for 15 hours. After the completion of the reaction, pyridine and excessively added di-tert-butyl dicarbonate were evaporated. As a result, the polysiloxane compound 3-1 was obtained in an amount of 2.073 g. The mass average molecular weight Mw of the polysiloxane compound 3-1 was determined to be 2652 by GPC. A composition 3-1 was prepared in the same manner as in Example 1-1 except for using the polysiloxane compound 3-1 in place of the polysiloxane compound 1-1 and for using 0.1 g of the photoacid generator CPI-100TF of the formula (8).

Example 3-2

Into a 20-mL flask, 1.476 g of the polysiloxane compound 1-2 obtained in Example 1-2, 0.031 g (0.25 mmol) of N,N-dimethyl-4-aminopyridine, 5 mL of pyridine and 2.183 g (10 mmol) of di-tert-butyl dicarbonate were put. The resulting solution was subjected to reaction by stirring at 100° C. for 15 hours. After the completion of the reaction, pyridine and excessively added di-tert-butyl dicarbonate were evaporated. As a result, the polysiloxane compound 3-2 was obtained in an amount of 1.449 g. The mass average molecular weight Mw of the polysiloxane compound 3-2 was determined to be 3766 by GPC. A composition 3-2 was prepared in the same manner as in Example 1-1 except for using the polysiloxane compound 3-2 in place of the polysiloxane compound 1-1.

Example 3-3

Into a 20-mL flask, 1.956 g of the polysiloxane compound 1-3 obtained in Example 1-3, 0.024 g (0.2 mmol) of N,N-dimethyl-4-aminopyridine, 5 mL of pyridine and 1.746 g (8 mmol) of di-tert-butyl dicarbonate were put. The resulting solution was subjected to reaction by stirring at 100° C. for 15 hours. After the completion of the reaction, pyridine and excessively added di-tert-butyl dicarbonate were evaporated. As a result, the polysiloxane compound 3-3 was obtained in an amount of 1.645 g. The mass average molecular weight Mw of the polysiloxane compound 3-3 was determined to be 5117 by GPC. A composition 3-3 was prepared in the same manner as in Example 1-1 except for using the polysiloxane compound 3-3 in place of the polysiloxane compound 1-1.

Example 3-4

Into a 20-mL flask, 1.764 g of the polysiloxane compound 1-4 obtained in Example 1-4, 0.027 g (0.22 mmol) of N,N-dimethyl-4-aminopyridine, 5 mL of pyridine and 1.921 g (8.8 mmol) of di-tert-butyl dicarbonate were put. The resulting solution was subjected to reaction by stirring at 100° C. for 15 hours. After the completion of the reaction, pyridine and excessively added di-tert-butyl dicarbonate were evaporated. As a result, the polysiloxane compound 3-4 was obtained in an amount of 1.573 g. The mass average molecular weight Mw of the polysiloxane compound 3-4 was determined to be 3125 by GPC. A composition 3-4 was prepared in the same manner as in Example 1-1 except for using the polysiloxane compound 3-4 in place of the polysiloxane compound 1-1.

Comparative Example 1

Into a 50-mL flask, 7.45 g (20 mmol) of 1,1-ditrifluoromethyl-1-hydroxy-3-triethoxysilylpropane of the following formula (8), 1.08 g (60 mmol) of water and 0.06 g (1 mmol) of acetic acid were put. The resulting solution was subjected to reaction by stirring at 100° C. for 12 hours. After the completion of the reaction, toluene was added to the solution. The solution was subjected to reflux (bath temperature: 150° C.) to evaporate water, by-produced ethanol and acetic acid and further evaporate toluene. As a result, the comparative polysiloxane compound 1 was obtained in an amount of 4.20 g. The mass average molecular weight Mw of the comparative polysiloxane compound 1 was determined to be 2860 by GPC; and the thermal decomposition temperature $T_{d5}$ of the comparative polysiloxane compound 1 was determined to be 318° C. A comparative composition 1 was prepared in the same manner as in Example 1-1 except for using the comparative polysiloxane compound 1 in place of the polysiloxane compound 1-1.

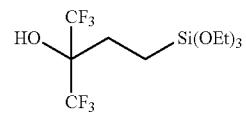

(9)

Comparative Example 1

Into a 50-mL flask, 4.00 g (9.21 mmol) of compound of the following formula (10), 0.497 g (27.63 mmol) of water and 0.028 g (0.461 mmol) of acetic acid were put. The resulting solution was subjected to reaction by stirring at 100° C. for 12 hours. After the completion of the reaction, toluene was added to the solution. The solution was subjected to reflux (bath temperature: 150° C.) to evaporate water, by-produced ethanol and acetic acid and further evaporate toluene. As a result, the comparative polysiloxane compound 2 was obtained in an amount of 2.98 g. The mass average molecular weight Mw of the comparative polysiloxane compound 2 was determined to be 5320 by GPC; and the thermal decomposition temperature $T_{d5}$ of the comparative polysiloxane compound 2 was determined to be 320° C. A comparative composition 2 was prepared in the same manner as in Example 1-1 except for using the comparative polysiloxane compound 2 in place of the polysiloxane compound 1-1.

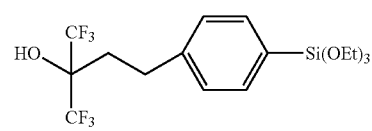

(10)

Comparative Example 3

Into a 50-mL flask, 19.83 g (100 mmol) of phenyltrimethoxysilane, 5.40 g (300 mmol) of water and 0.3 g (5 mmol) of acetic acid were put. The resulting solution was subjected to reaction by stirring at 100° C. for 12 hours. After the completion of the reaction, toluene was added to the solution. The solution was subjected to reflux (bath temperature: 150° C.) to evaporate water, by-produced ethanol and acetic acid and further evaporate toluene. As a result, the comparative polysiloxane compound 3 was obtained in an amount of 11.7 g. The mass average molecular weight Mw of the comparative polysiloxane compound 3 was determined to be 3500 by GPC; and the thermal decomposition temperature $T_{d5}$ of the comparative polysiloxane compound 2 was determined to be 500° C. A comparative composition 3 was prepared in the same manner as in Example 1-1 except for using the comparative polysiloxane compound 3 in place of the polysiloxane compound 1-1.

[Evaluation of Thermal Decomposition Temperature]

The polysiloxane compounds obtained in Examples 1-1 to 1-4 and the comparative polysiloxane compounds obtained in Comparative Examples 1 to 3 were tested for the thermal decomposition temperatures ($T_{d5}$) by the above-mentioned thermal decomposition temperature test method. The test results are summarized in TABLE 1.

TABLE 1

| Test sample | $T_{d5}$ (° C.) |
|---|---|
| Polysiloxane compound 1-1 | 397 |
| Polysiloxane compound 1-2 | 388 |
| Polysiloxane compound 1-3 | 408 |
| Polysiloxane compound 1-4 | 419 |
| Comparative polysiloxane compound 1 | 318 |
| Comparative polysiloxane compound 2 | 320 |
| Comparative polysiloxane compound 3 | 500 |

[Evaluation of Alkaline Developer Solubility]

The compositions of Examples 1-1 to 3-4 and the comparative compositions of Comparative Examples 1 to 2 were spin-coated (at 500 rpm) on silicon wafers (manufactured by SUMCO Corporation, diameter: 4 inches, thickness: 525 µm) and dried on a hot plate at 90° C. for 1 minute, thereby forming positive photosensitive resin films of 1.8 to 3.6 µm thickness. The thickness of the positive photosensitive resin films was measured by a stylus type surface profiler (Dektak 8 manufactured by ULVAC Inc.). Subsequently, the positive photosensitive resin films were tested for the solubility in an aqueous solution of 2.38 mass % tetramethylammonium hydroxide as a developer by a Resist Develop Analyzer Model RDA-790 (manufactured by Litho Tech Japan Corporation). In the solubility test, each of the positive photosensitive resin films was immersed in the aqueous TMAH solution for 3 minutes. The solubility was evaluated as "○" when the positive photosensitive resin film was removed from the silicon wafer. The solubility was evaluated as "X" when the positive photosensitive resin film remained without being removed from the silicon wafer. In addition to the above solubility test, positive photosensitive resin films were formed from the compositions of Examples 3-1 to 3-4 on silicon wafers in the same manner as above, exposed for 10 minutes by an exposure machine (MUV-351 manufactured by MORITEX Corporation) and tested for the solubility in the same manner as above. The test results are shown in TABLE 2.

[Evaluation of Film Loss]

The compositions of Examples 3-1 to 3-4 were spin-coated (at 500 rpm) on silicon wafers (manufactured by SUMCO Corporation, diameter: 4 inches, thickness: 525 µm) and dried on a hot plate at 90° C. for 1 minute, thereby forming positive photosensitive resin films of 3.0 to 3.5 µm thickness. The thickness of the positive photosensitive resin films was measured as an initial film thickness by a stylus type surface profiler (Dektak 8 manufactured by ULVAC Inc.). After that, the positive photosensitive resin films on the silicon wafers were immersed for 3 minutes in an aqueous solution of 2.38 mass % tetramethylammonium hydroxide as a developer by a Resist Develop Analyzer Model RDA-790 (manufactured by Litho Tech Japan Corporation), washed with water and then dried. Upon the completion of the above series of processes, the thickness of the positive photosensitive resin films remaining on the silicon wafers was measured. Each film loss (units: nm) was determined by subtracting the remaining film thickness from the initial film thickness. The film loss determination results are shown in TABLE 2.

TABLE 2

| Test Sample | | Solubility test result | Film Loss (nm) |
|---|---|---|---|
| Example 1-1 | | ○ | — |
| Example 1-2 | | ○ | — |
| Example 1-3 | | ○ | — |
| Example 1-4 | | ○ | — |
| Example 2-1 | | ○ | — |
| Example 2-2 | | ○ | — |
| Example 2-3 | | ○ | — |
| Example 2-4 | | ○ | — |
| Example 3-1 | without exposure | X | 7 |
| | with exposure | ○ | — |
| Example 3-2 | without exposure | X | 3 |
| | with exposure | ○ | — |
| Example 3-3 | without exposure | X | 4 |
| | with exposure | ○ | — |
| Example 3-4 | without exposure | X | 22 |
| | with exposure | ○ | — |
| Comparative Example 1 | | ○ | — |
| Comparative Example 2 | | ○ | — |
| Comparative Example 3 | | X | — |

As shown in TABLE 2, the positive photosensitive resin films formed from the compositions 1-1 to 2-4 and the comparative compositions 1 to 2 were dissolved in the alkaline developer and did not remain at all after immersed in the alkaline developer for 3 minutes. The positive photosensitive resin films formed from the compositions 3-1 to 3-4 remained without being almost dissolved after immersed in the alkaline developer for 3 minutes but, by exposure to light in the above test, became soluble in the alkaline developer and did not remain at all after immersed in the alkaline developer for 3 minute. It has been shown by these test results that: it was possible to suppress loss of the film against the alkaline developer by introducing an acid labile group into the polysiloxane compound; and it was on the other hand possible to impart alkali solubility to the film by using the photoacid generator in the film and exposing the film. The resin film formed from the comparative composition 3 was hardly dissolved in the alkaline developer and remained after immersed in the alkaline developer for 3 minutes.

It has been shown by the thermal decomposition temperature test results of TABLE 1 that the polysiloxane compounds 1-1 to 1-4 according to the present invention had better thermal stability than the comparative siloxane compounds 1 and 2. Further, it has been shown that the compositions 1-1 to 1-4 showed good solubility whereas the comparative composition 3 did not at all show solubility in the solubility test.

[Development Test]

Figure 2:
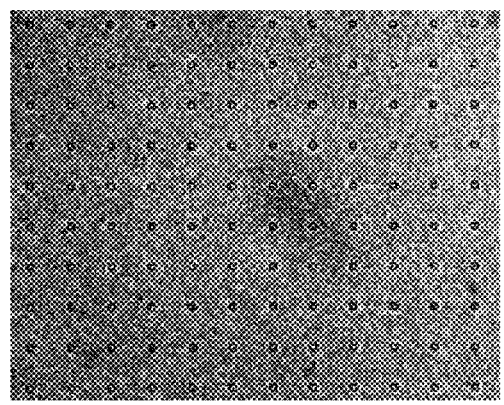
FIG. 2 is a photograph of a hole pattern formed from a composition 1-3 according to Example 1-3 of the present invention.
Figure 3:
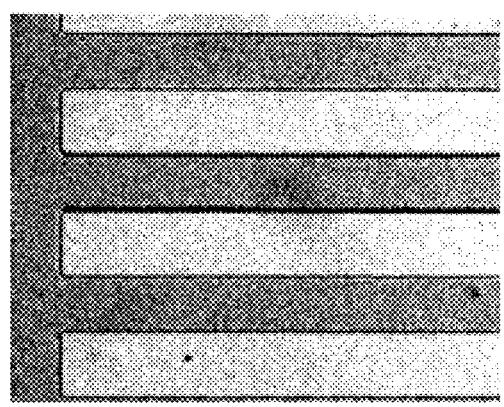
FIG. 3 is a photograph of a line pattern formed from a composition 1-4 according to Example 1-4 of the present invention.
Figure 4:
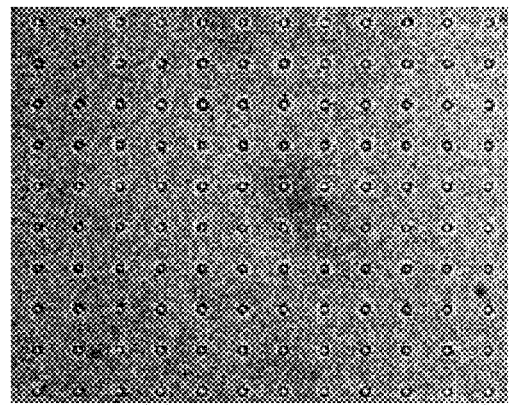
FIG. 4 is a photograph of a hole pattern formed from a composition 1-4 according to Example 1-4 of the present invention.
Figure 5:
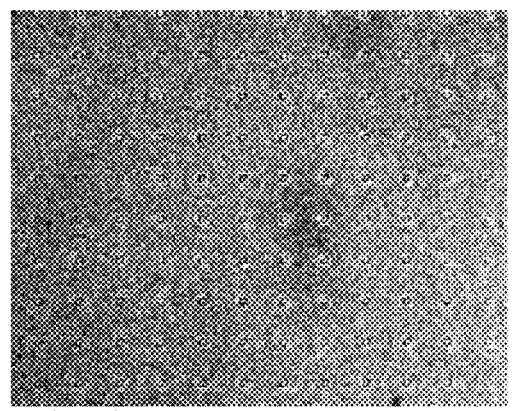
FIG. 5 is a photograph of a hole pattern formed from a composition 2-3 according to Example 2-3 of the present invention.
Figure 6:
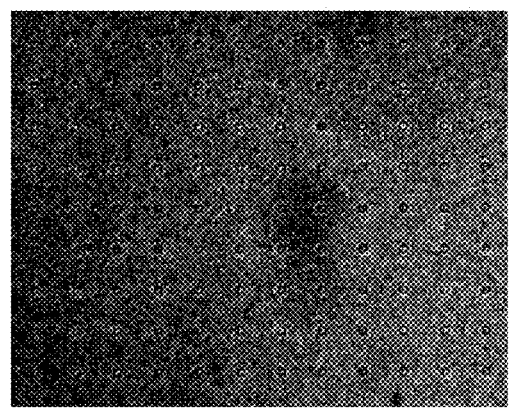
FIG. 6 is a photograph of a hole pattern formed from a composition 2-4 according to Example 2-4 of the present invention.
Figure 7:
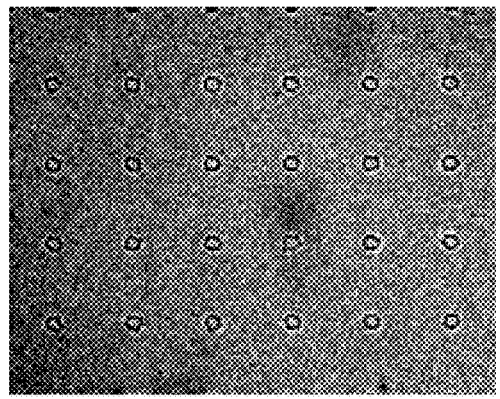
FIG. 7 is a photograph of a hole pattern formed from a composition 3-1 according to Example 3-1 of the present invention.
Figure 8:
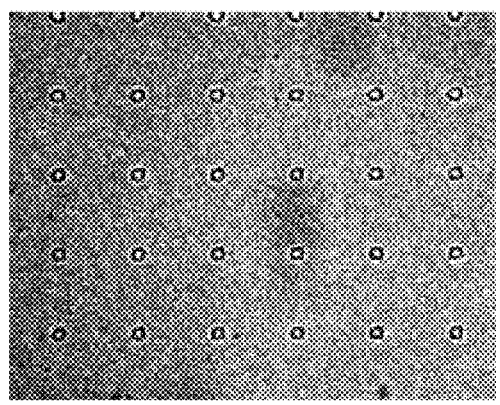
FIG. 8 is a photograph of a hole pattern formed from a composition 3-2 according to Example 3-2 of the present invention.
Figure 9:
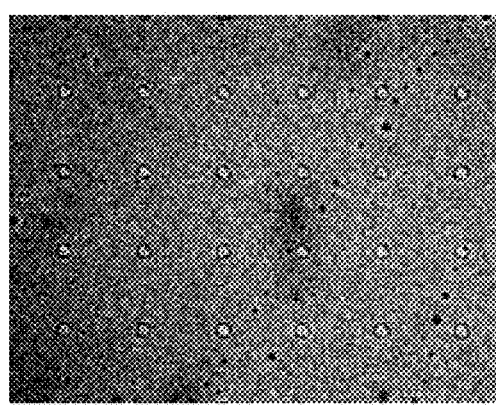
FIG. 9 is a photograph of a hole pattern formed from a composition 3-3 according to Example 3-3 of the present invention.
Figure 10:
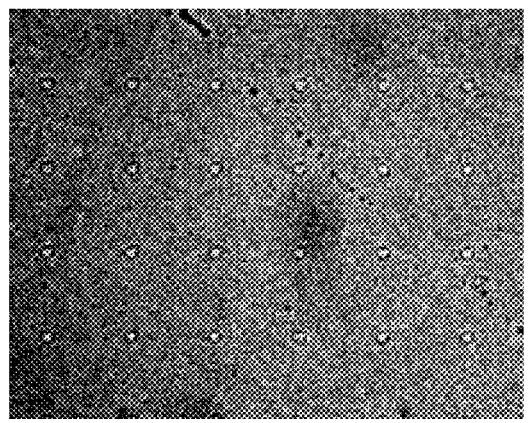
FIG. 10 is a photograph of a hole pattern formed from a composition 3-4 according to Example 3-4 of the present invention.

The compositions of Examples 1-3, 1-4, 2-3, 2-4 and 3-1 to 3-4 were spin-coated (at 500 rpm) on silicon wafers (manufactured by SUMCO Corporation, diameter: 4 inches, thickness: 525 µm) and dried on a hot plate at 90° C. for 1 minute, thereby forming positive photosensitive resin films of 3.0 to 3.5 µm thickness. Each of the positive photosensitive resin films was exposed for 10 minutes by an exposure machine (MUV-351 manufactured by MORITEX Corporation) through a light shielding plate (mask) with lines of 300 µm width or holes of 12 µm diameter, and then, subjected to development test. In the development test, the respective resin films were developed into patterns by immersion in 2.38 mass % aqueous TMAH solution and washing with water. Photographs of the developed patterns are shown in FIGS. 1 to 10. It has been shown by these test results that the positive photosensitive resin films formed from the compositions of Examples 1-3, 1-4, 2-3, 2-4 and 3-1 to 3-4 had positive developability.

[Evaluation of Heat-Resistant Transparency]

The compositions of Examples 1-1 to 3-4 were spin-coated (at 500 rpm) on transparent glass plates of 1.1 mm thickness and dried on a hot plate at 90° C. for 1 minute, thereby forming positive photosensitive resin films of 1.3 to 3.5 μm thickness. The positive photosensitive resin films were cured by heating in an oven of 250° C. for 1 hour. The cured films were tested for the UV transmittance at 400 nm (by SHIMADZU UV-3150). The film thickness of the positive photosensitive resin films and the transmittance of the cured films measured by the heat-resistant transparency test are shown in TABLE 3. It has been shown by these test results that the positive photosensitive resin films formed from the compositions of Examples 1-1 to 3-4 had high heat-resistant transparency even after heated at 250° C. for 1 hour.

TABLE 3

| Test Sample | Film thickness (μm) | Transmittance (%) |
|---|---|---|
| Example 1-1 | 2.7 | >95 |
| Example 1-2 | 2.8 | >95 |
| Example 1-3 | 2.75 | >95 |
| Example 1-4 | 3.5 | >95 |
| Example 2-1 | 1.6 | >95 |
| Example 2-2 | 1.3 | >95 |
| Example 2-3 | 2.1 | >95 |
| Example 2-4 | 1.4 | >95 |
| Example 3-1 | 1.31 | >81 |
| Example 3-2 | 2.16 | >86 |
| Example 3-3 | 2.54 | >89 |
| Example 3-4 | 2.51 | >88 |

The invention claimed is:

1. A positive photosensitive resin composition, comprising at least:

component (A): a polysiloxane compound having at least a structural unit of the general formula (1)

$$[(R^X)_b R^1_m SiO_{n/2}]  \quad (1)$$

where $R^X$ represents a group of the following formula; $R^1$ each independently represents a hydrogen atom, a $C_1$-$C_3$ alkyl group, a phenyl group, a hydroxy group, a $C_1$-$C_3$ alkoxy group, or a $C_1$-$C_3$ fluoroalkyl group; b represents an integer of 1 to 3; m represents an integer of 0 to 2; n represents an integer of 1 to 3; and b, m and n satisfy a relationship of b+m+n =4,

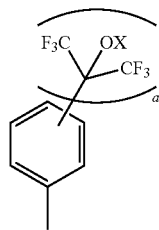

where X each independently represents a hydrogen atom or an acid labile group; and a represents an integer of 1 to 5;

component (B): a photoacid generator or a quinone diazide compound; and component (C): a solvent.

2. The positive photosensitive resin composition according to claim 1, wherein, in $R^X$ of the general formula (1), a is an integer of 1 to 3.

3. The positive photosensitive resin composition according to claim 1, wherein $R^X$ of the general formula (1) is any of the following formulas

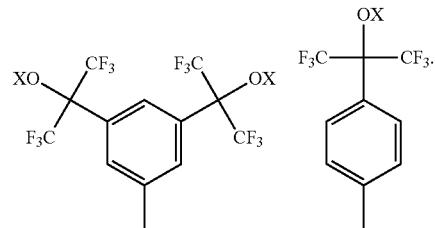

4. The positive photosensitive resin composition according to claim 1, wherein, in the general formula (1), b is 1.

5. The positive photosensitive resin composition according to claim 4, wherein, in the general formula (1), n is 3.

6. The positive photosensitive resin composition according to claim 1, wherein the polysiloxane compound as the component (A) further has a structural unit of the general formula (2)

$$[Si(R^Y)_p O_{q/2}]  \quad (2)$$

where $R^Y$ each independently represents a hydrogen atom, a $C_1$-$C_3$ alkyl group, a phenyl group, a $C_1$-$C_3$ alkoxy group or a $C_1$-$C_3$ fluoroalkyl group; p represents an integer of 0 to 3; q represents an integer of 1 to 4; and p and q satisfy a relationship of p+q =4.

7. The positive photosensitive resin composition according to claim 6, wherein the number of the structural units of the general formula (2) in the polysiloxane compound as the component (A) is 0.1 to 10 per one structural unit of the general formula (1).

8. The positive photosensitive resin composition according to claim 6, wherein, in the general formula (1), n is 3.

9. The positive photosensitive resin composition according to claim 1, further comprising at least one kind selected from the group consisting of a surfactant, a silane coupling agent and a dissolution inhibitor.

10. A positive photosensitive resin film formed from the positive photosensitive resin composition according to claim 1.

11. A method for producing a patterned cured film, comprising:

forming a positive photosensitive resin film by applying the positive photosensitive resin composition according to claim 1 to a substrate and drying the applied positive photosensitive resin composition;

exposing the positive photosensitive resin film;

developing the exposed positive photosensitive resin film with an aqueous alkaline solution, thereby obtaining a patterned resin film; and heating the patterned resin film.

12. A patterned cured film produced by the method according to claim 11.

13. The method according to claim 11, wherein $R^X$ of the general formula (1) is any of the following formulas

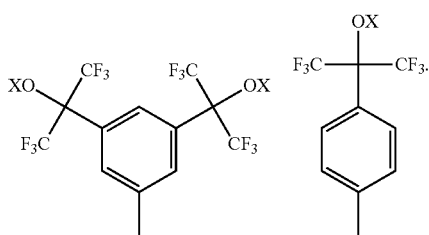

14. The method according to claim 11, wherein, in the general formula (1), b is 1.

15. The method according to claim 14, wherein, in the general formula (1), n is 3.

16. The method according to claim 11, wherein the polysiloxane compound as the component (A) further has a structural unit of the general formula (2)

$$[Si(R^Y)_p O_{q/2}] \qquad (2)$$

where $R^Y$ each independently represents a hydrogen atom, a $C_1$-$C_3$ alkyl group, a phenyl group, a $C_1$-$C_3$ alkoxy group, or a $C_1$-$C_3$ fluoroalkyl group; p represents an integer of 0 to 3; q represents an integer of 1 to 4; and p and q satisfy a relationship of p+q =4.

17. The method according to claim 16, wherein the number of the structural units of the general formula (2) in the polysiloxane compound as the component (A) is 0.1 to 10 per one structural unit of the general formula (1).

18. The method according to claim 16, wherein, in the general formula (1), n is 3.

19. A laminated body comprising at least the patterned cured film according to claim 12 and a substrate.

20. An electronic component comprising the patterned cured film produced by the method according to claim 11 as a surface protective film or an interlayer insulating film.

21. A method for producing a patterned resin film, comprising:
forming a positive photosensitive resin film by applying the positive photosensitive resin composition according to claim 1 to a substrate and drying the applied positive photosensitive resin composition;
exposing the positive photosensitive resin film; and
developing the exposed positive photosensitive resin film with an aqueous alkaline solution, thereby obtaining the patterned resist film.

22. The method according to claim 21, wherein $R^X$ of the general formula (1) is any of the following formulas

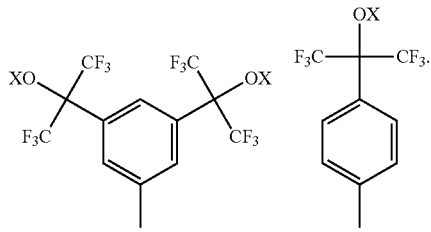

23. The method according to claim 21, wherein, in the general formula (1), b is 1.

24. The method according to claim 23, wherein, in the general formula (1), n is 3.

25. The method according to claim 21, wherein the polysiloxane compound as the component (A) further has a structural unit of the general formula (2)

$$[Si(R^Y)_p O_{q/2}] \qquad (2)$$

where $R^Y$ each independently represents a hydrogen atom, a $C_1$-$C_3$ alkyl group, a phenyl group, a $C_1$-$C_3$ alkoxy group, or a $C_1$-$C_3$ fluoroalkyl group; p represents an integer of 0 to 3; q represents an integer of 1 to 4; and p and q satisfy a relationship of p+q =4.

26. The method according to claim 25, wherein the number of the structural units of the general formula (2) in the polysiloxane compound as the component (A) is 0.1 to 10 per one structural unit of the general formula (1).

27. The method according to claim 25, wherein, in the general formula (1), n is 3.

\* \* \* \* \*